(12) United States Patent
Kim et al.

(10) Patent No.: US 12,501,757 B2
(45) Date of Patent: Dec. 16, 2025

(54) PIXEL AND DISPLAY DEVICE INCLUDING THE SAME

(71) Applicant: Samsung Display Co., LTD., Yongin-si (KR)

(72) Inventors: Hyun Kim, Yongin-si (KR); Jin Taek Kim, Yongin-si (KR); Jeong Su Park, Yongin-si (KR); Jong Chan Lee, Yongin-si (KR); Jung Eun Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 554 days.

(21) Appl. No.: 17/945,220

(22) Filed: Sep. 15, 2022

(65) Prior Publication Data

US 2023/0148430 A1 May 11, 2023

(30) Foreign Application Priority Data

Nov. 9, 2021 (KR) .......................... 10-2021-0153299

(51) Int. Cl.
*H10H 29/14* (2025.01)
*G09G 3/32* (2016.01)
*H10H 20/80* (2025.01)
*H10H 20/821* (2025.01)
(Continued)

(52) U.S. Cl.
CPC ........ *H10H 29/142* (2025.01); *H10H 20/821* (2025.01); *H10H 20/84* (2025.01); *H10H 20/8512* (2025.01); *G09G 3/32* (2013.01); *G09G 2300/0426* (2013.01); *G09G 2300/0819* (2013.01); *G09G 2300/0842* (2013.01); *H10H 20/882* (2025.01)

(58) Field of Classification Search
CPC .... H10H 29/142; H10H 20/821; H10H 20/84; H10H 20/8512; H10H 20/882; G09G 3/32
See application file for complete search history.

(56) References Cited

U.S. PATENT DOCUMENTS

| 10,872,931 B2 | 12/2020 | Kim et al. |
| 2007/0103056 A1* | 5/2007 | Cok ..................... H10K 59/351 313/506 |
| 2021/0028236 A1 | 1/2021 | Kim et al. |

(Continued)

FOREIGN PATENT DOCUMENTS

| KR | 10-1553343 | 9/2015 |
| KR | 10-1557402 | 10/2015 |

(Continued)

*Primary Examiner* — Mark W Tornow
(74) *Attorney, Agent, or Firm* — CANTOR COLBURN LLP

(57) ABSTRACT

An embodiment provides a display device including a pixel disposed in a display area. The pixel includes a light emitting part that includes a light emitting element, pixel electrodes disposed on a first end portion and a second end portion of the light emitting element, and at least one insulating layer, a light conversion layer disposed on the light emitting part, the light conversion layer including light conversion particles, and a first layer disposed between the light emitting part and the light conversion layer. A refractive index of the first layer is equal to or less than a refractive index of the at least one insulating layer.

20 Claims, 13 Drawing Sheets

(51) Int. Cl.
*H10H 20/84* (2025.01)
*H10H 20/851* (2025.01)

(56) References Cited

U.S. PATENT DOCUMENTS

2022/0077227 A1* 3/2022 Kang ................. H01H 25/0753
2022/0130325 A1* 4/2022 Lee ..................... H01H 20/821
2023/0006119 A1* 1/2023 Oh ........................ H01L 21/768

FOREIGN PATENT DOCUMENTS

| KR | 10-1619452 | 5/2016 |
| KR | 1020190110660 A | 10/2019 |
| KR | 1020210012101 A | 2/2021 |

* cited by examiner

PX: PX1, PX2, PX3

PIXEL AND DISPLAY DEVICE INCLUDING THE SAME

CROSS-REFERENCE TO RELATED APPLICATION(S)

This application claims priority to and benefits of Korean Patent Application No. 10-2021-0153299 under 35 U.S.C. § 119, filed Nov. 9, 2021, in the Korean Intellectual Property Office, the entire contents of which are incorporated herein by reference.

BACKGROUND

1. Technical Field

The disclosure relates to a pixel and a display device including the same.

2. Description of the Related Art

Recently, interest in information displays is increasing. Accordingly, research and development on display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The embodiments provide a pixel and a display device including the pixel that may reduce or prevent deterioration of a light conversion layer and may increase light efficiency.

Objectives of the embodiments are not limited to the objectives mentioned above, and other technical objectives that are not mentioned may be clearly understood to a person of an ordinary skill in the art using the following description.

An embodiment provides a display device including a pixel disposed in a display area. The pixel may include a light emitting part that includes a light emitting element, pixel electrodes disposed on a first end portion and a second end portion of the light emitting element, and at least one insulating layer, a light conversion layer disposed on the light emitting part, the light conversion layer including light conversion particles, and a first layer disposed between the light emitting part and the light conversion layer. A refractive index of the first layer may be equal to or less than a refractive index of the at least one insulating layer.

The at least one insulating layer may include at least one of a first insulating layer disposed under the light emitting element, a second insulating layer disposed on a portion of the light emitting element, the second insulating layer exposing the first end portion and the second end portion of the light emitting element, and a third insulating layer disposed on one of the pixel electrodes and disposed between the pixel electrodes.

The first layer may contact a portion of the first insulating layer, and a refractive index of the first layer may be equal to or less than a refractive index of the first insulating layer.

The first layer may contact a portion of the third insulating layer, and the refractive index of the first layer may be equal to or less than a refractive index of the third insulating layer.

The first layer may include an inorganic film disposed in a light emitting area of the pixel, the light emitting area being provided with the light emitting part.

The first layer may be disposed on an entire area of the display area including the light emitting area.

The first layer may be individually patterned to correspond to the light emitting area, and may be disposed on an entire area of the light emitting area.

The first layer may include an organic film disposed in a light emitting area of the pixel, the light emitting area provided with the light emitting part. The pixel may include a second layer disposed between the first layer and the light conversion layer, the second layer including an inorganic layer.

The first layer may be disposed on an entire area of the display area including the light emitting area. The second layer may be disposed on an entire upper portion of the first layer in at least the light emitting area.

The first layer may be individually patterned to correspond to the light emitting area. The second layer may be disposed on an entire area of the display area including the light emitting area.

The first layer may be individually patterned to correspond to the light emitting area. The second layer may be individually patterned to correspond to the light emitting area, and may be disposed on an entire area of the light emitting area.

The first layer may include a light scattering layer that is disposed on an entire area of a light emitting area of the pixel, the light emitting area being provided with the light emitting part, the light scattering layer including light scattering particles.

The light conversion particles may include quantum dots.

An embodiment provides a pixel, including a light emitting part that includes a light emitting element, pixel electrodes disposed on a first end portion and a second end portion of the light emitting element, and at least one insulating layer, a light conversion layer disposed on the light emitting part, the light conversion layer including light conversion particles, and a first layer disposed between the light emitting part and the light conversion layer. A refractive index of first layer may be equal to or less than a refractive index of the at least one insulating layer.

The at least one insulating layer may include at least one of a first insulating layer disposed under the light emitting element, a second insulating layer disposed on a portion of the light emitting element, the second insulating layer exposing the first end portion and the second end portion of the light emitting element, and a third insulating layer disposed on one of the pixel electrodes and between the pixel electrodes.

The first layer may contact a portion of the first insulating layer. The refractive index of the first layer may be equal to or less than a refractive index of the first insulating layer.

The first layer may contact a portion of the third insulating layer. The refractive index of the first layer may be equal to or less than a refractive index of the third insulating layer.

The first layer may include an inorganic film disposed on an entire area of in a light emitting area of the pixel, the light emitting area being provided with the light emitting part.

The first layer may include an organic film disposed on an entire area of a light emitting area of the pixel, the light emitting area being provided with the light emitting part. The pixel may include an inorganic film disposed between the first layer and the light conversion layer.

The first layer may include a light scattering layer that is disposed on an entire area of a light emitting area of the pixel, the light emitting area being provided with the light emitting part, the light scattering layer including light scattering particles.

Other embodiments are described in the detailed description and drawings.

According to the embodiments, by disposing a first layer between a light emitting part and a light conversion layer of a pixel, it is possible to protect the light conversion layer from heat and light generated from the light emitting part. Accordingly, it is possible to reduce or prevent deterioration of the light conversion layer, and to improve reliability of a pixel and a display device including the same.

According to the embodiments, the first layer may be formed as a low refractive layer and/or a light scattering layer having a refractive index equal to or less than that of at least one insulating layer provided in the light emitting part. Accordingly, it is possible to increase an amount of light incident on the light conversion layer and to improve light efficiency of a pixel and a display device including the same.

Effects of embodiments are not limited by what is illustrated in the above, and other effects may be included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
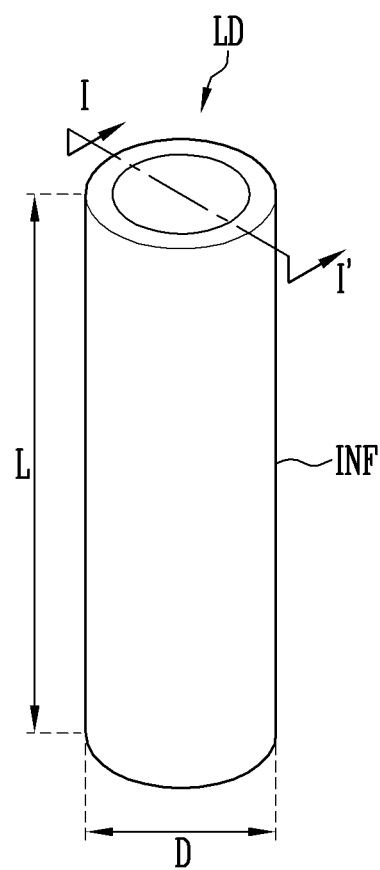
FIG. 1 illustrates a schematic perspective view of a light emitting element according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the description below, singular forms are to include plural forms unless the context clearly indicates only the singular. As used herein, the singular forms, "a," "an," and "the" are intended to include the plural forms as well, unless the context clearly indicates otherwise.

The embodiments are not limited to embodiments disclosed below, and it is to be understood that the embodiments include all modifications, equivalents, and substitutions without departing from the scope and spirit of the embodiments. Each embodiment disclosed below may be implemented alone, or may be implemented in combination with other embodiments.

Throughout the accompanying drawings, the same reference numerals are used as far as possible for elements that are identical or similar to each other. In describing the embodiments, redundant descriptions of the same or similar elements will be omitted or simplified.

In describing the embodiments, the term "connection" may comprehensively mean a physical and/or electrical connection. This may comprehensively mean a direct connection and an indirect connection, and may comprehensively mean an integral connection and a non-integral connection.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations "About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within #30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
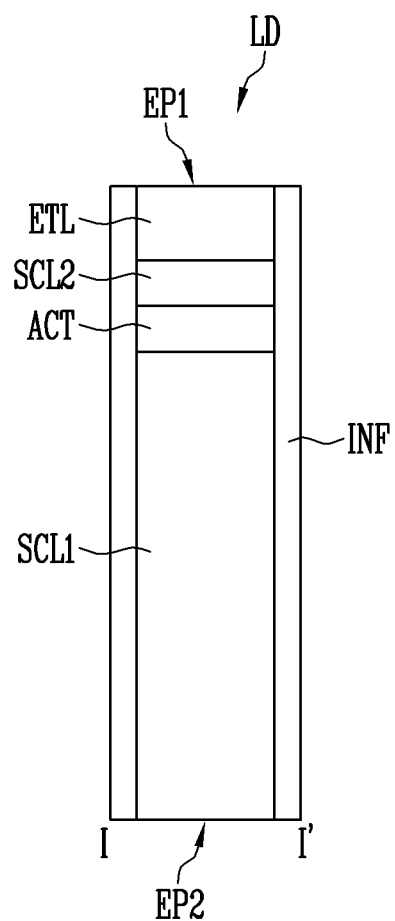
FIG. 2 illustrates a schematic cross-sectional view of a light emitting element according to an embodiment.

FIG. 1 illustrates a schematic perspective view of a light emitting element LD according to an embodiment. FIG. 2 illustrates a cross-sectional view of a light emitting element LD according to an embodiment. For example, FIG. 1 shows an example of the light emitting element LD that may be used as a light source of a pixel according to an embodiment, and FIG. 2 shows an example of a cross-section of the emitting element LD taken along a line I-I' of FIG. 1.

Referring to FIG. 1 and FIG. 2, the light emitting element LD may include a first semiconductor layer SCL1, an active layer ACT (also referred to as a "light emitting layer"), a second semiconductor layer SCL2 that are sequentially disposed and/or stacked along one direction (for example, a length direction), and an insulating film INF covering outer circumferential surfaces (for example, side surfaces) of the first semiconductor layer SCL1, the active layer ACT, and the second semiconductor layer SCL2. In an embodiment, the light emitting element LD may further include an electrode layer ETL disposed on the second semiconductor layer SCL2. The insulating film INF may or may not at least partially cover the outer circumferential surface of the electrode layer ETL. In some embodiments, the light emitting element LD may further include another electrode layer disposed on a surface (for example, a lower surface) of the first semiconductor layer SCL1.

In an embodiment, the light emitting element LD may be provided in a rod-like shape. In describing the embodiment, the rod shape includes a rod-like shape or bar-like shape of various types including a circular pillar shape or a polygonal pillar shape, and a shape of a cross-section thereof is not particularly limited. In an embodiment, a length L of the light emitting element LD may be larger than a diameter D thereof (or a width of a lateral cross-section thereof), but is not limited thereto.

The light emitting element LD may include a first end portion EP1 and a second end portion EP2. In an embodiment, the first end portion EP1 and the second end portion EP2 may face each other. For example, the light emitting element LD may include the first end portion EP1 and the second end portion EP2 at both ends of a length direction (or a thickness direction) thereof. The first end portion EP1 of the light emitting element LD may include a first base surface (for example, an upper surface) of the light emitting element LD and/or a peripheral area thereof. The second end portion EP2 of the light emitting element LD may include a second base surface (for example, a lower surface) of the light emitting element LD and/or a peripheral area thereof.

The first semiconductor layer SCL1, the active layer ACT, the second semiconductor layer SCL2, and the electrode layer ETL may be sequentially disposed in a direction from the second end portion EP2 to the first end portion EP1 of the light emitting element LD. For example, the electrode layer ETL (or second semiconductor layer SCL2) may be disposed on the first end portion EP1 of the light emitting element LD, and the first semiconductor layer SCL1 (or another electrode layer adjacent to the first semiconductor layer SCL1 and electrically connected to the first semiconductor layer SCL1) may be disposed on the second end portion EP2 of the light emitting element LD.

The first semiconductor layer SCL1 may include a first conductive type of semiconductor layer including a first conductive type of dopant. For example, the first semiconductor layer SCL1 may be an N-type of semiconductor layer including an N-type of dopant.

In some embodiments, the first semiconductor layer SCL1 may include a nitride-based semiconductor material or a phosphide-based semiconductor material. For example, the first semiconductor layer SCL1 may include a nitride-based semiconductor material including at least one of GaN, AlGaN, InGaN, AlInGaN, AlN, and InN, or a phosphide-based semiconductor material including at least one of GaP, GaInP, AlGaP, AlGaInP, AlP, and InP. In an embodiment, the first semiconductor layer SCL1 may include an N-type of dopant such as Si, Ge, Sn, or the like. The material included in the first semiconductor layer SCL1 is not limited thereto, and other materials may be used to form the first semiconductor layer SCL1.

The active layer ACT may be disposed on the first semiconductor layer SCL1. The active layer ACT may include a single or multiple quantum well (QW) structure. When a voltage equal to or greater than the threshold voltage is applied to respective ends of the light emitting element LD, electron-hole pairs may be recombined in the active layer ACT, and thus light may be emitted.

In some embodiments, the active layer ACT may emit light of a visible ray wavelength band, for example, light of about 400 nm to about 900 nm wavelength band. For example, the active layer ACT may emit blue light having a wavelength ranging from about 450 nm to about 480 nm, green light having a wavelength ranging from about 480 nm to about 560 nm, or red light having a wavelength ranging from about 620 nm to about 750 nm. The color and/or wavelength band of the light generated by the active layer ACT may be changed.

In some embodiments, the active layer ACT may include a nitride-based semiconductor material or a phosphide-based semiconductor material. For example, the active layer ACT may include a nitride-based semiconductor material including at least one of GaN, AlGaN, InGaN, InGaAlN, AlN, InN, and AlInN, or a phosphide-based semiconductor material including at least one of GaP, GaInP, AlGaP, AlGaInP, AlP, and InP. Other materials may be used to form the active layer ACT.

In some embodiments, the active layer ACT may include an element (for example, indium (In)) that is involved in a color (or wavelength band) of light. The color of light generated in the active layer ACT may be controlled by adjusting a content and/or composition ratio of the element.

The second semiconductor layer SCL2 may be disposed on the active layer ACT. The second semiconductor layer SCL2 may include a second conductive type of semiconductor layer including a second conductive type of dopant. For example, the second semiconductor layer SCL2 may be a P-type of semiconductor layer including a P-type of dopant.

In some embodiments, the second semiconductor layer SCL2 may include a nitride-based semiconductor material or a phosphide-based semiconductor material. For example, the second semiconductor layer SCL2 may include a nitride-based semiconductor material including at least one of GaN, AlGaN, InGaN, AlInGaN, AlN, and InN, or a phosphide-based semiconductor material including at least one of GaP, GaInP, AlGaP, AlGaInP, AlP, and InP. In an embodiment, the second semiconductor layer SCL2 may include a P-type of dopant such as Mg. Various materials may be used to form the second semiconductor layer SCL2.

In an embodiment, the first semiconductor layer SCL1 and the second semiconductor layer SCL2 may include the same semiconductor material, but may include dopants of different conductive types. In other examples, the first semiconductor layer SCL1 and the second semiconductor layer SCL2 may include different semiconductor materials, and may include dopants of different conductive types.

In some embodiments, the first semiconductor layer SCL1 and the second semiconductor layer SCL2 may have different lengths (or thicknesses) in the length direction of the light emitting element LD. For example, the first semiconductor layer SCL1 may have a longer length (or thicker thickness) than that of the second semiconductor layer SCL2 along the length direction of the light emitting element LD. Accordingly, the active layer ACT may be positioned closer to the first end portion EP1 (for example, the P-type of end portion) than the second end portion EP2 (for example, the N-type of end portion).

The electrode layer ETL may be disposed on the second semiconductor layer SCL2. The electrode layer ETL may protect the second semiconductor layer SCL2, and may be a contact electrode for electrically connecting the second semiconductor layer SCL2 to at least one circuit element, an electrode, and/or a wire. For example, the electrode layer ETL may be an ohmic contact electrode or a Schottky contact electrode.

In some embodiments, the electrode layer ETL may include metal or a metal oxide. For example, the electrode layer ETL may be formed by singly using or mixing a metal such as chromium (Cr), titanium (Ti), aluminum (Al), gold (Au), nickel (Ni), or copper (Cu), and an oxide or alloy thereof, and a transparent conductive material such as an indium tin oxide (ITO), an indium zinc oxide (IZO), an indium tin zinc oxide (ITZO), a zinc oxide (ZnO), or an indium oxide ($In_2O_3$). Various conductive materials may be used to form the electrode layer ETL.

In some embodiments, the electrode layer ETL may be substantially transparent. Accordingly, light generated by the light emitting element LD may pass through the electrode layer ETL to be emitted from the first end portion EP1 of the light emitting element LD.

The insulating film INF may be provided on a surface of the light emitting element LD to surround side surfaces of the first semiconductor layer SCL1, the active layer ACT, the second semiconductor layer SCL2, and/or the electrode layer ETL. Accordingly, electrical stability of the light emitting element LD may be improved, and short circuit defects through the light emitting element LD may be prevented.

The insulating film INF may expose the electrode layer ETL (or second semiconductor layer SCL2) and the first semiconductor layer SCL1 (or another electrode layer provided at the second end portion EP2 of the light emitting element LD) at the first end portion EP1 and the second end portion EP2 of the light emitting element LD, respectively. For example, the insulating film INF may not be provided on two base surfaces corresponding to the first and second end portions EP1 and EP2 of the light emitting element LD (for example, an upper surface and a lower surface of the light emitting element LD). Accordingly, by connecting the first end portion EP1 and the second end portion EP2 of the light emitting element LD to at least one electrode, a wire, and/or a conductive pattern, respectively, an electrical signal (for example, driving power source voltage and/or driving signal) may be applied to the light emitting element LD.

When the insulating film INF is provided on the surface of the light emitting element LD, it is possible to improve life-span and efficiency thereof by minimizing surface defects of the light emitting element LD. Even when the light emitting elements LD are adjacent to each other, it is possible to prevent a short circuit defect from occurring between the light emitting elements LD.

In an embodiment, the light emitting element LD may be manufactured through a surface treatment process. For example, the light emitting elements LD may be surface-treated by using a hydrophobic material. Accordingly, when the light emitting elements LD are mixed with a fluid solution (or an ink) and supplied to each light emitting area (for example, a light emitting area of the pixel), the light emitting elements LD may not be non-uniformly aggregated in the solution and may be uniformly distributed.

The insulating film INF may include a transparent insulating material. Accordingly, light generated by the active layer ACT may transmit through the insulating film INF to be emitted to the outside of the light emitting element LD. For example, the insulating film INF may include at least one insulating material of a silicon oxide ($SiO_x$) (for example, $SiO_2$), a silicon nitride ($SiN_x$) (for example, $Si_3N_4$), an aluminum oxide ($Al_xO_y$) (for example, $Al_2O_3$), and a titanium oxide ($Ti_xO_y$) (for example, $TiO_2$), but is not limited thereto.

The insulating film INF may be configured as a single layer or multilayer. For example, the insulating film INF may be formed as a double film.

In some embodiments, the insulating film INF may be partially etched (or removed) at a portion corresponding to at least one of the first end portion EP1 and the second end portion EP2 of the light emitting element LD. For example, the insulating film INF may be obliquely etched at the first end portion EP1 of the light emitting element LD, but the shape of the insulating film INF is not limited thereto.

In some embodiments, the light emitting element LD may have a small size in a range of nanometers to micrometers. For example, the light emitting element LD may each have the diameter D (or a width of a lateral cross-section) and/or the length L ranging from a nanometer to micrometer. For example, the light emitting element LD may have a diameter D and/or a length L ranging from approximately several tens of nanometers to several tens of micrometers.

The structure, shape, size, and/or type of the light emitting element LD may be changed according to embodiments. For example, the structure, shape, size, and/or type of the light emitting element LD may be changed according to design conditions of a light emitting device using the light emitting element LD or a light emitting characteristic that is a design requirement.

The light emitting device including the light emitting element LD may be used in various types of devices that require a light source. For example, the light emitting elements LD may be disposed in a pixel of a display device, and the light emitting elements LD may be used as a light source of the pixel. The light emitting element LD may be used in other types of devices that require a light source, such as a lighting device.

Figure 3:
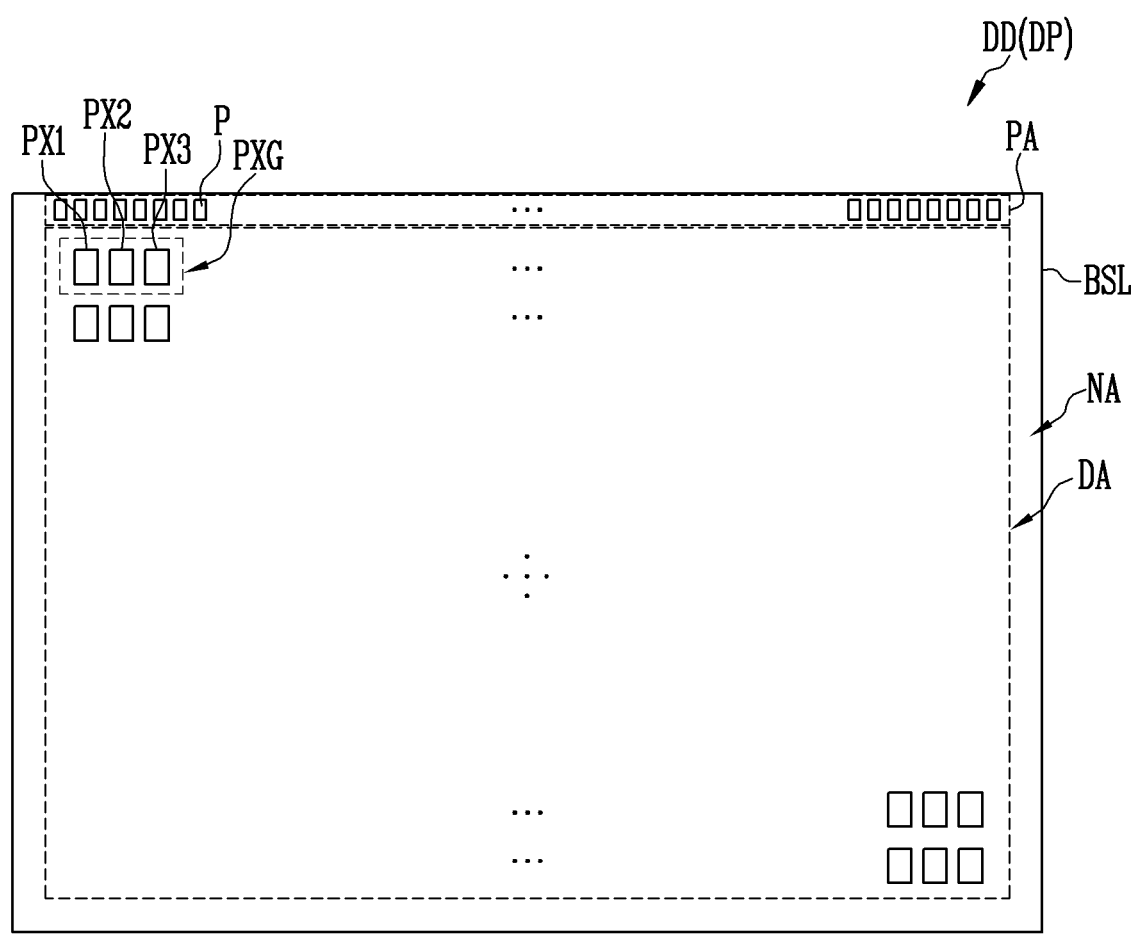
FIG. 3 illustrates a schematic top plan view of a display device according to an embodiment.
Figure 3:
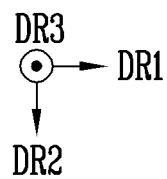

FIG. 3 illustrates a schematic top plan view of a display device DD according to an embodiment. FIG. 3 schematically illustrates a structure of the display device DD based on a display panel DP including a display area DA. The display device DD may further include a driving circuit (for example, a scan driver, a data driver, a timing controller, and the like) for driving pixels PX.

Referring to FIG. 3, the display device DD may include a base layer BSL, and the pixels PX disposed on the base layer BSL. The base layer BSL and the display device DD including the pixels may be provided in various shapes. For example, the base layer BSL and the display device DD may be provided in a plate shape having a substantially rectangular shape when viewed in a plan view, and may include angled or rounded corners. The shapes of the base layer BSL and the display device DD may be changed according to embodiments.

FIG. 3 illustrates the display device DD having a quadrangular plate shape. A horizontal direction (for example, a row direction or a horizontal direction) of the display device DD is defined as a first direction DR1, a vertical direction (for example, a column direction or a vertical direction) of the display device DD is referred to as a second direction DR2, and a thickness direction (or a height direction) of the display device DD is referred to as a third direction DR3.

The base layer BSL may be a base member for configuring the display device DD. For example, the base layer BSL may configure a base surface of the display device DD.

The base layer BSL and the display device DD including the same may include a display area DA for displaying an image, and a non-display area NA positioned around the display area DA.

The display area DA is an area in which the pixels PX are disposed, and may be an area in which an image is displayed by the pixels PX. In an embodiment, the display area DA may be disposed in the base layer BSL and a central area of the display device DD (for example, a central area of the display panel DP).

The display area DA may have various shapes. For example, the display area DA may have various shapes including a rectangular shape, a circular shape, or an elliptical shape. In an embodiment, the display area DA may have a shape corresponding to the shape of the base layer BSL.

The non-display area NA may be an area excluding the display area DA. In an embodiment, the non-display area NA may be disposed in edge areas of the base layer BSL and the display device DD to surround the display area DA. A portion of the non-display area NA may be a pad area PA in which pads P are disposed.

The pixels PX may be disposed in the display area DA. For example, the display area DA may include pixel areas in which respective pixels PX are provided and/or disposed.

In an embodiment, at least two kinds of pixels PX for emitting light of different colors may be disposed in the display area DA. For example, in the display area DA, a first pixels PX1 emitting light of the first color, a second pixels PX2 emitting light of the second color, and a third pixels PX3 emitting light of the third color may be arranged. At least one first pixel PX1, at least one second pixel PX2, and at least one third pixel PX3 disposed to be adjacent to each other may configure one pixel group PXG. The number, type, and/or mutual disposition structure of the pixels PX configuring each pixel group PXG may be variously changed according to embodiments.

In an embodiment, the first pixel PX1 may be a red pixel for emitting red light, and the second pixel PX2 may be a green pixel for emitting green light. The third pixel PX3 may be a blue pixel for emitting blue light. The color of light emitted from each of the pixels PX may be variously changed according to embodiments.

Each of the pixels PX may include at least one light emitting element LD. For example, the pixel PX may include the light emitting element LD described in an embodiment of FIG. 1 and FIG. 2. For example, the pixel PX may include the light emitting element LD including the first semiconductor layer SCL1, the active layer ACT, the second semiconductor layer SCL2, the electrode layer ETL, and/or the insulating film INF. In an embodiment, each light emitting element LD may have a size in a range of approximately nanometers to micrometers and may have a rod shape, but is not limited thereto. The number, type, structure, and/or size of the light emitting elements LD provided in each pixel PX may be changed according to embodiments.

In an embodiment, the first pixel PX1, the second pixel PX2, and the third pixel PX3 may have light emitting elements LD of different colors as light sources. Accordingly, the first pixel PX1, the second pixel PX2, and the third pixel PX3 may emit light of different colors.

In an embodiment, the first pixel PX1, the second pixel PX2, and the third pixel PX3 may include the light emitting elements LD emitting light of the same color as each other, and a light conversion layer including wavelength conversion particles (for example, quantum dots) may be disposed in light emitting areas of the first pixel PX1, the second pixel PX2, and/or the third pixel PX3.

For example, the first pixel PX1, the second pixel PX2, and the third pixel PX3 may include blue light emitting elements. A light conversion layer including wavelength conversion particles (for example, red quantum dots) of the first color may be disposed in the light emitting area of the first pixel PX1, and a light conversion layer including wavelength conversion particles (for example, green quantum dots) of the second color may be disposed in the light emitting area of the second pixel PX2. Accordingly, the first pixel PX1 may emit light of the first color (for example, red light), and the second pixel PX2 may emit light of the second color (for example, green light). The pixels PX may have a structure according to at least one of embodiments to be described below.

In the non-display area NA, wires connected to the pixels PX of the display area DA, and/or internal circuit parts may be disposed. A portion of the non-display area NA may be set as the pad area PA, and the pads P may be disposed to the pad area PA. The pads P may include signal pads and/or power pads to which driving signals and/or power source voltages necessary for driving the pixels PX are applied.

Figure 4:
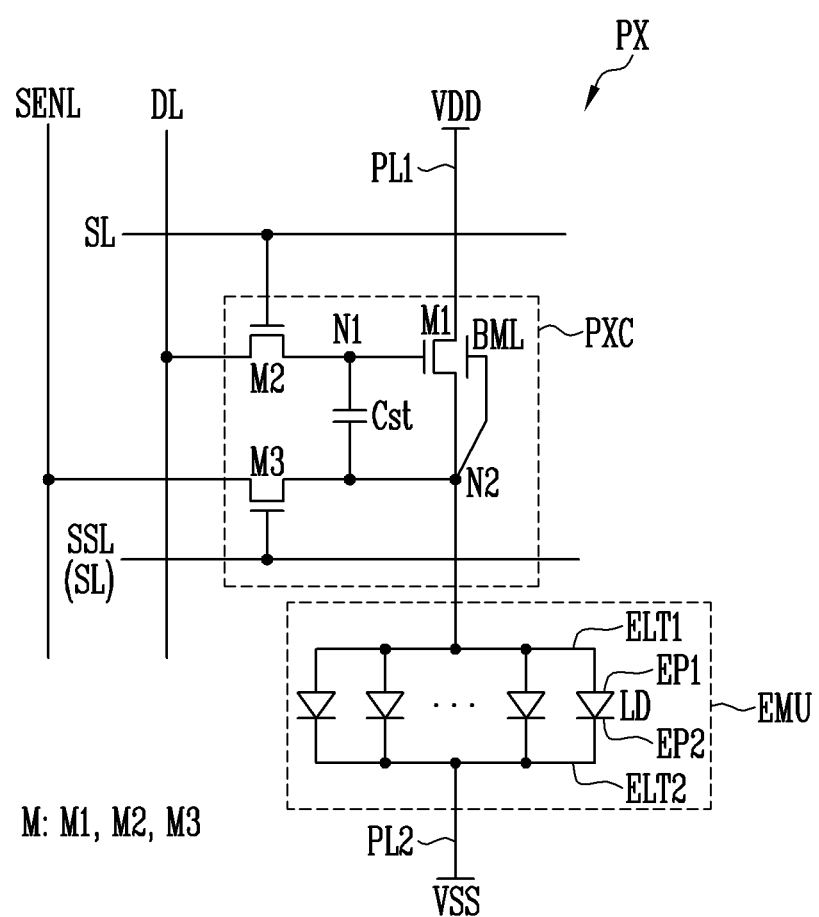
FIG. 4 and FIG. 5 illustrate schematic diagrams of equivalent circuits of a pixel according to embodiments.
Figure 5:
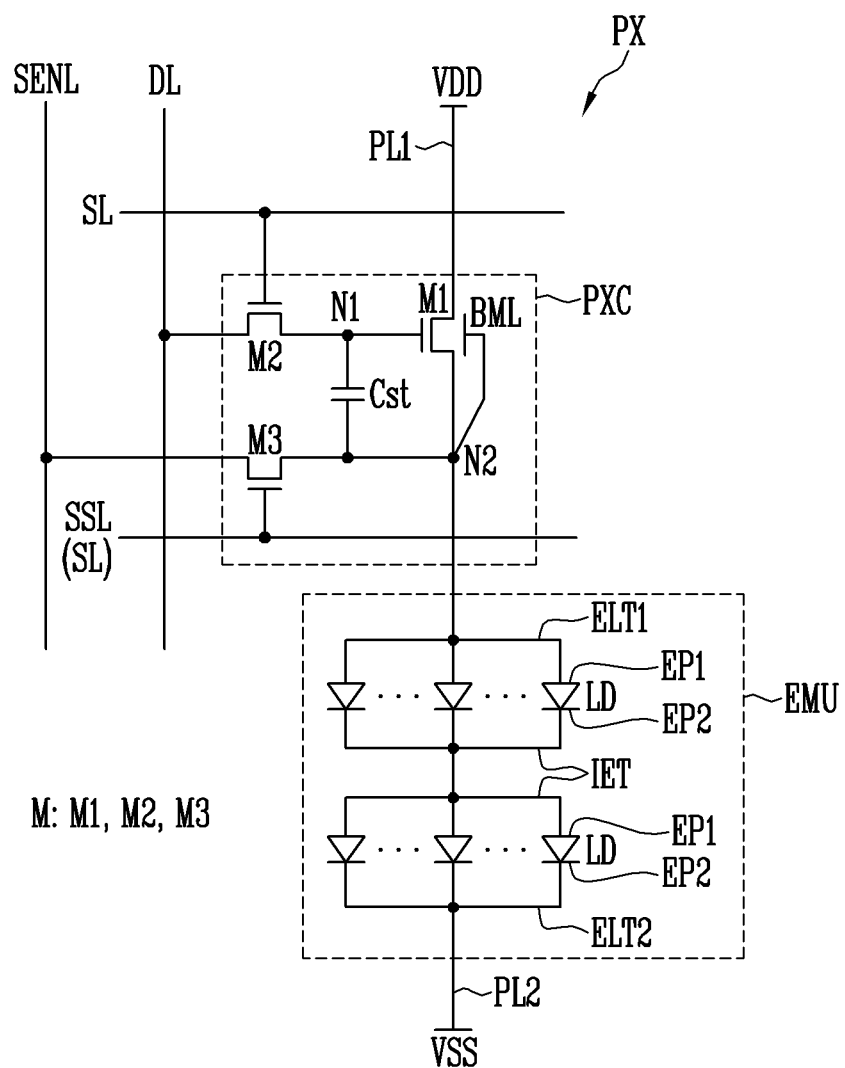

FIG. 4 and FIG. 5 illustrate circuit diagrams (schematic diagrams of equivalent circuits) of the pixel PX according to the embodiments. For example, FIG. 4 and FIG. 5 illustrate the pixels PX including light emitting parts EMU having different structures. Each pixel PX illustrated in FIG. 4 and FIG. 5 may be one of the pixels PX disposed in the display area DA of FIG. 3. The pixels PX of a display device DD (refer to FIG. 3) may have substantially the same or similar structure to each other.

Referring to FIG. 4 and FIG. 5, the pixel PX may be electrically connected to a scan line SL (also referred to as a "first scan line"), a data line DL, a first power line PL1, and a second power line PL2. The pixel PX may be electrically connected to at least one other power line and/or signal line. For example, the pixel PX may be electrically connected to a sensing line SENL (also referred to an "initialization power line") and/or a control line SSL (also referred to as a "second scan line").

The pixel PX may include the light emitting part EMU for generating light of luminance corresponding to each data signal. The pixel PX may further include a pixel circuit PXC for driving the light emitting part EMU.

The pixel circuit PXC may be electrically connected to the scan line SL and the data line DL, and may be electrically connected between the first power line PL1 and the light emitting part EMU. For example, the pixel circuit PXC may be electrically connected to the scan line SL to which a first scan signal is supplied, the data line DL to which a data signal is supplied, the first power line PL1 to which a voltage of a first power source VDD is applied, and the light emitting part EMU.

The pixel circuit PXC may be selectively electrically connected to the control line SSL to which a second scan signal is supplied, and the sensing line SENL electrically connected to a reference power source (or initialization power source) or a sensing circuit in response to a display period or sensing period. The second scan signal may be the same as or different from the first scan signal. When the second scan signal is the same signal as the first scan signal, the control line SSL may be integrated with the scan line SL.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be electrically connected between the first power line PL1 and a second node N2. The second node N2 may be a node at which the pixel circuit PXC and the light emitting part EMU are electrically connected to each other. For example, the second node N2 may be a node in which one electrode (for example, a source electrode) of the first transistor M1 and a first pixel electrode ELT1 of the light emitting part EMU are electrically connected to each other. A gate electrode of the first transistor M1 may be electrically connected to a first node N1. The first transistor M1 may control a driving current supplied to the light emitting part EMU in response to a voltage of the first node N1. For example, the first transistor M1 may be a driving transistor of the pixel PX.

In an embodiment, the first transistor M1 may further include a bottom metal layer BML (also referred to as "back gate electrode" or "second gate electrode"). In an embodiment, the bottom metal layer BML may be electrically connected to an electrode (for example, a source electrode) of the first transistor M1.

In an embodiment in which the first transistor M1 includes the bottom metal layer BML, by applying a back-biasing voltage to the bottom metal layer BML of the first transistor M1, a back-biasing technique (or a sync technique) of moving a threshold voltage of the first transistor M1 in a negative or positive direction may be applied. When the bottom metal layer BML is disposed to a lower portion of a semiconductor pattern configuring a channel of the first transistor M1, light incident on the semiconductor pattern is blocked, thereby stabilizing an operational characteristic of the first transistor M1.

The second transistor M2 may be electrically connected between the data line DL and the first node N1. A gate electrode of the second transistor M2 may be electrically connected to the scan line SL. When a first scan signal of a gate-on voltage (for example, a logic high voltage or a high level voltage) is supplied from the scan line SL, the second transistor M2 may be turned on to electrically connect the data line DL and the first node N1.

For each frame period, a data signal of the corresponding frame may be supplied to the data line DL, and the data signal may be transmitted to the first node N1 through the second transistor M2 during a period in which the first scan signal of the gate-on voltage is supplied. For example, the second transistor M2 may be a switching transistor for transmitting each data signal to the inside of the pixel PX.

A first electrode of the capacitor Cst may be electrically connected to the first node N1, and the second electrode of the capacitor Cst may be electrically connected to the second node N2. The capacitor Cst may be charged with a voltage corresponding to the data signal supplied to the first node N1 during each frame period.

The third transistor M3 may be electrically connected between the second node N2 and the sensing line SENL. A gate electrode of the third transistor M3 may be electrically connected to the control line SSL (or the scan line SL). The third transistor M3 may be turned on when the second scan signal (or first scan signal) of a gate-on voltage is supplied from the control line SSL to transmit the reference voltage (or initialization voltage) supplied to the sensing line SENL to the second node N2 or to transmit the voltage of the second node N2 to the sensing line SENL. In an embodiment, the voltage of the second node N2 may be transmitted to the sensing circuit through the sensing line (SENL), and may be provided to the driving circuit (for example, timing controller) to be used for compensating the characteristic deviation of the pixels PX.

In FIG. 4 and FIG. 5, the transistors M included in the pixel circuit PXC are illustrated as N-type transistors, but embodiments are not limited thereto. For example, at least one of the first, second, and third transistors M1, M2, and M3 may be changed to a P-type transistor. The structure and driving method of the pixel circuit PXC may be changed according to embodiments.

The light emitting part EMU may include at least one light emitting element LD. In an embodiment, the light emitting part EMU may include a single light emitting element LD electrically connected in a forward direction between the first power source VDD and the second power source VSS. In another example, the light emitting part EMU may include the light emitting elements LD that are electrically connected in a forward direction between the first power source VDD and the second power source VSS. At least one light emitting element LD electrically connected to in a forward direction between the first power source VDD and the second power source VSS may configure an effective light source of the pixel PX.

In an embodiment, the light emitting part EMU includes a first pixel electrode ELT1 (also referred to as a "first electrode") and a second pixel electrode ELT2 (also referred to as a "second electrode") electrically connected to the at least one light emitting element LD. The first pixel electrode ELT1 may be electrically connected between the first end portion EP1 of the at least one light emitting element LD and the first power line PL1. For example, the first pixel electrode ELT1 may be electrically connected to the first end portion EP1 of the at least one light emitting element LD, and may be electrically connected to the first power line PL1 through the pixel circuit PXC. The second pixel electrode ELT2 may be electrically connected between the second end portion EP2 of the at least one light emitting element LD and the second power line PL2.

In an embodiment, the light emitting part EMU may include the light emitting elements LD electrically connected in parallel between the pixel circuit PXC and the second power line PL2 as shown in FIG. 4. The first end portions EP1 of the light emitting elements LD may be electrically connected to the pixel circuit PXC, and may be electrically connected to the first power line PL1 through the pixel circuit PXC. The second end portions EP2 of the light emitting elements LD may be electrically connected to the second power line PL2. A voltage of the first power source VDD may be applied to the first power line PL1, and a voltage of the second power source VSS may be applied to the second power line PL2. In an embodiment, the first power source VDD may be a high potential pixel power source, and the second power source VSS may be a low potential pixel power source.

The number, type, and/or structure of the light emitting elements LD configuring the effective light source of the pixel PX may be changed according to embodiments. The arrangement and/or connection structure of the light emitting elements LD may also be changed according to embodiments.

In an embodiment, the light emitting part EMU may include the light emitting elements LD electrically connected in parallel-series between the pixel circuit PXC and the second power line PL2 as shown in FIG. 5. For example, the light emitting elements LD may be arranged and/or electrically connected to at least two serial stages between the pixel circuit PXC and the second power line PL2, and each serial stage may include at least one light emitting element LD electrically connected in a forward direction between the first power source VDD and the second power source VSS.

In an embodiment, the light emitting part EMU may further include at least one intermediate electrode IET (also referred to as a "third pixel electrode" or "third electrode") connected to between two consecutive serial stages. For example, the light emitting part EMU may include the intermediate electrode IET electrically connected between the second end portion EP2 of at least one light emitting element LD provided in the first serial stage and the first end portion EP1 of at least one light emitting element LD provided in the second serial stage.

The light emitting elements LD may emit light with luminance corresponding to a driving current supplied through the pixel circuit PXC. During each frame period, the pixel circuit PXC may supply a driving current corresponding to the data signal to the light emitting part EMU. The light emitting elements LD may emit light by the driving current. Accordingly, the light emitting part EMU may emit light with a luminance corresponding to the driving current.

Figure 6:
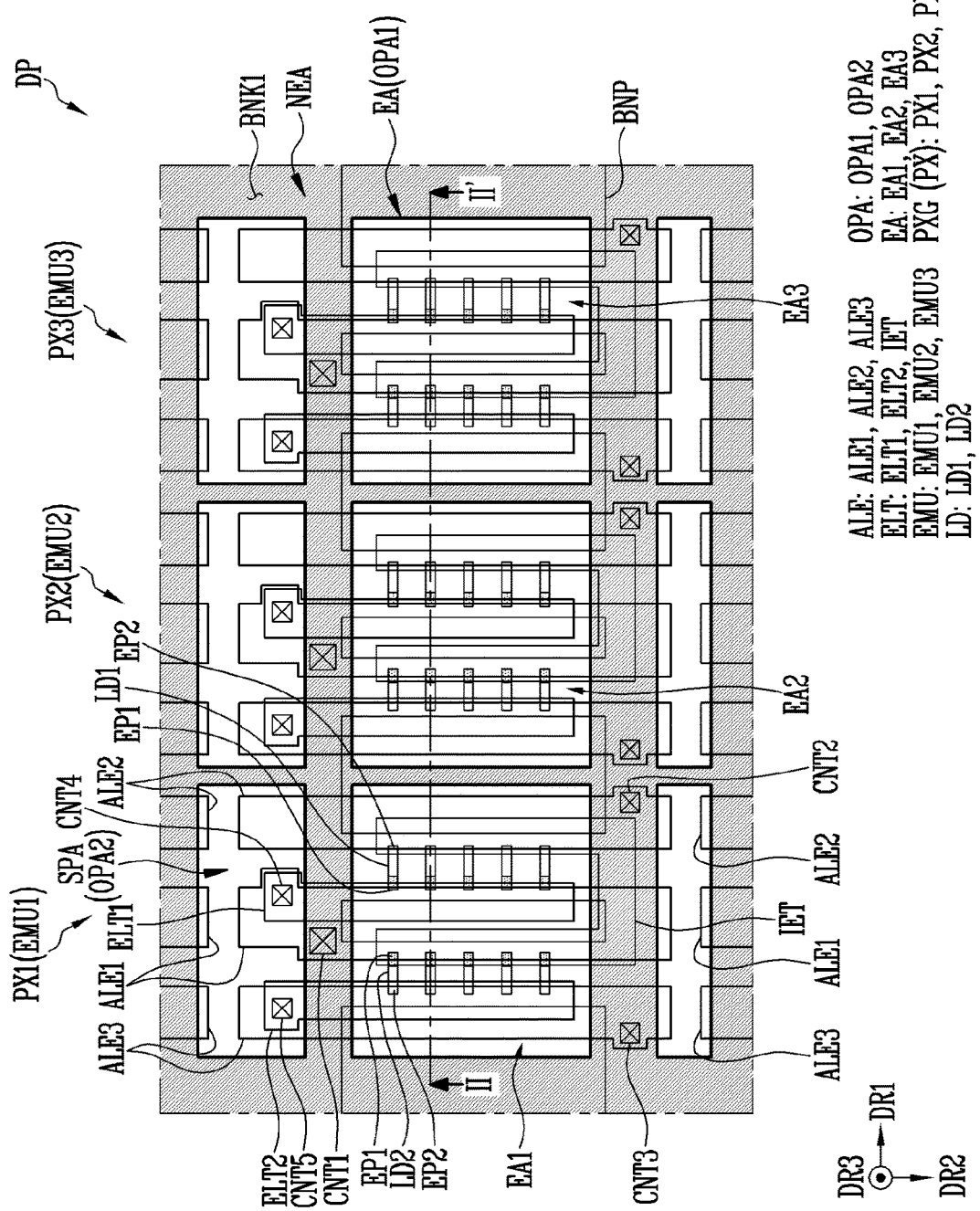
FIG. 6 and FIG. 7 illustrate schematic top plan views of a display panel according to embodiments.
Figure 7:
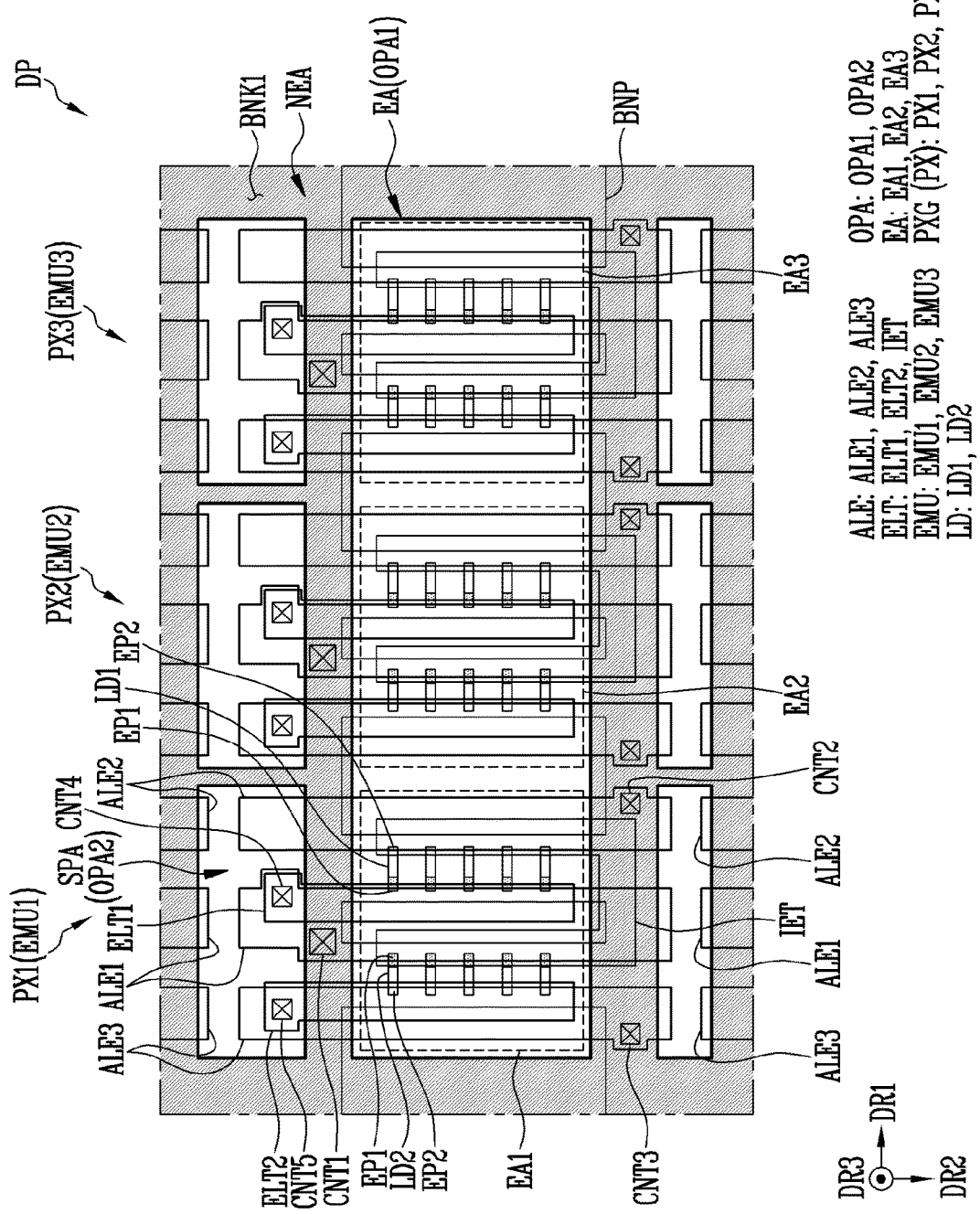

FIG. 6 and FIG. 7 illustrate schematic top plan views of a display panel DP according to embodiments. For example, FIG. 6 and FIG. 7 illustrates a structure of the display panel DP based on an area in which the first pixel PX1, the second pixel PX2, and the third pixel PX3 configuring one pixel group PXG among the pixels PX provided in the display area DA of FIG. 3 are disposed. FIG. 6 and FIG. 7 illustrate the structure of the display panel DP based on the light emitting part EMU of the first pixel PX1, the second pixel PX2, and the third pixel PX3. FIG. 6 and FIG. 7 illustrate different examples with respect to the first bank BNK1.

Referring to FIG. 3 to FIG. 7, the pixel group PXG may include a light emitting area EA in which the light emitting elements LD of the pixels PX configuring the corresponding pixel group PXG are disposed. The light emitting area EA of each pixel group PXG may include respective light emitting areas EA corresponding to respective pixels PX configuring the corresponding pixel group PXG.

The first pixel PX1 may include a first light emitting area EA1 that includes at least one light emitting element LD and electrodes disposed around the light emitting element LD. The second pixel PX2 may include a second light emitting area EA2 that is positioned around the first light emitting area EA1 and includes at least one light emitting element LD and electrodes disposed around the light emitting element LD. The third pixel PX3 may include a third light emitting area EA3 that is positioned around the first light emitting area EA1 and/or the second light emitting area EA2 and includes at least one light emitting element LD and electrodes disposed around the light emitting element LD. The pixel group PXG may include the light emitting area EA including the first light emitting area EA1, the second light emitting area EA2, and the third light emitting area EA3.

In an embodiment, the pixels PX may be formed to have a similar or identical structure to each other. Accordingly, in FIG. 6 and FIG. 7, reference numerals are denoted based on the configuration of the first pixel PX1.

In an embodiment, each light emitting area EA may include at least two light emitting elements LD, and electrodes electrically connected to the light emitting elements LD. In an embodiment, the electrodes may include alignment electrodes ALE and pixel electrodes ELT (also referred to as "contact electrodes"). Each light emitting area EA may include bank patterns BNP disposed under the electrodes.

The alignment electrodes ALE may have various shapes, and may be spaced apart from each other. In an embodiment, the alignment electrodes ALE may be spaced apart from each other along the first direction DR1, and each thereof may have an extended shape along the second direction DR2. In an embodiment, the first direction DR1 may be a horizontal direction of the display panel DP, and the second direction DR2 may be a vertical direction of the display panel DP, but the embodiments are not limited thereto. The third direction DR3 crossing the first direction DR1 and the second direction DR2 may be a thickness direction (or a height direction) of the display panel DP.

The shape, size, number, position, and/or mutual disposition structure of the alignment electrodes ALE may be changed according to embodiments. The alignment electrodes ALE may have a shape and/or size similar to or the same as each other, or may have different shapes and sizes.

The alignment electrodes ALE may include at least two electrodes spaced apart from each other. For example, the alignment electrodes ALE may include a first alignment electrode ALE1 and a second alignment electrode ALE2, and may optionally further include a third alignment electrode ALE3.

In an embodiment, the first alignment electrode ALE1 may be positioned at a center of each light emitting area EA. The second alignment electrode ALE2 and the third alignment electrode ALE3 may be disposed at both sides of the first alignment electrode ALE1.

The alignment electrodes ALE (or alignment lines before being separated into the alignment electrodes ALE of each of the pixels PX) may receive alignment signals necessary for aligning the light emitting elements LD in an aligning step of the light emitting elements LD during the manufacturing process of the display device including pixels PX. Accordingly, an electric field is formed between the alignment electrodes ALE, so that the light emitting elements LD may be aligned and/or arranged between the alignment electrodes ALE. When the light emitting elements LD are aligned and/or arranged between the alignment electrodes ALE, it means that at least a portion of each of the light emitting elements LD is disposed between the alignment electrodes ALE.

For example, the first alignment electrode ALE1, the second alignment electrode ALE2, and the third alignment electrode ALE3 (or a first alignment line in which the first alignment electrodes ALE1 of the pixels PX are connected, a second alignment line in which the second alignment electrodes ALE2 of the pixels PX are connected, and a third alignment line in which the third alignment electrodes ALE3 of the pixels PX are connected) may receive a first alignment signal, a second alignment signal, and a third alignment signal in the aligning step of the light emitting elements LD, respectively. The first alignment signal and the second alignment signal may have different waveforms, potentials, and/or phases. Accordingly, an electric field is formed between the first alignment electrode ALE1 and the second alignment electrode ALE2, so that the light emitting elements LD (for example, first light emitting elements LD1) may be aligned between the first alignment electrode ALE1 and the second alignment electrode ALE2. The first alignment signal and the third alignment signal may have different waveforms, potentials, and/or phases. Accordingly, an electric field is formed between the first alignment electrode ALE1 and the third alignment electrode ALE3, so that the light emitting elements LD (for example, second light emitting elements LD2) may be aligned between the first alignment electrode ALE1 and the third alignment electrode ALE3. The third alignment signal may be the same as or different from the second alignment signal.

The alignment electrodes ALE may be disposed in each light emitting areas EA, and may extend to a separation area SPA through a non-light emitting area NEA around the light emitting area EA. The separation area SPA may be an area in which each alignment line (for example, the first alignment line, the second alignment line, and the third alignment line) is separated into the alignment electrodes ALE (for example, the first alignment electrode ALE1, the second alignment electrode ALE2, and the third alignment electrode ALE3) of each of the pixels PX after alignment of the light emitting elements LD is completed, and may be disposed on at least one side of each light emitting area EA.

Each pixel group PXG may include at least one separation area SPA disposed around the light emitting area EA. End portions of at least one electrode configuring the pixel group PXG (for example, end portions of the alignment electrodes ALE) may be disposed in each separation area SPA.

In an embodiment, each alignment electrode ALE may have an individual separated pattern for each pixel PX. For example, the first, second, and third alignment electrodes ALE1, ALE2, and ALE3 of each of the pixels PX may respectively have an individually separated pattern. However, the embodiments are not limited thereto. For example, in a structure in which the second pixel electrodes ELT2 of the pixels PX may be commonly connected to the second power line PL2, the alignment electrodes ALE (for example, the third alignment electrodes ALE3 of the pixels PX) connected to the second pixel electrodes ELT2 are integrated with each other without being disconnected between the light emitting areas EA adjacent to each other along the first direction DR1 and/or the second direction DR2.

In an embodiment, the first alignment electrode ALE1 may be electrically connected to a pixel circuit PXC and/or the first power line PL1 of the corresponding pixel PX disposed in a pixel circuit layer (for example, a circuit layer PCL of FIG. 8 to FIG. 13) through a first contact portion CNT1. The first alignment signal may be supplied to the first alignment electrode ALE1 (or the first alignment wire) through at least one wire (for example, the first power line PL1) disposed in the pixel circuit layer.

The first contact portion CNT1 may include at least one contact hole and/or a via hole. In an embodiment, the first contact portion CNT1 may be positioned in the non-light emitting area NEA positioned around each light emitting area EA, but the position of the first contact portion CNT1 may be changed according to embodiments. For example, the first contact portion CNT1 may be disposed to each light emitting area EA or separation area SPA. In FIG. 6 and FIG. 7, the first contact portions CNT1 are substantially disposed at the same position in the first, second, and third light emitting areas EA1, EA2, and EA3, but the positions of the first contact portions CNT1 may be changed according to the structure of the pixel circuit PXC and the light emitting part EMU of each pixel PX.

In an embodiment, the second alignment electrode ALE2 may be electrically connected to the second power line PL2 positioned in the pixel circuit layer through the second contact portion CNT2. The second alignment signal may be supplied to the second alignment electrode ALE2 (or the second alignment wire) through the second power line PL2.

In an embodiment, the third alignment electrode ALE3 may be electrically connected to the second power line PL2 positioned in the pixel circuit layer through the third contact portion CNT3. The second alignment signal may also be supplied to the third alignment electrode ALE3 (or the third alignment wire) through the second power line PL2.

The second contact portion CNT2 and the third contact portion CNT3 may each include at least one contact hole and/or via hole. In an embodiment, the second contact portion CNT2 and the third contact portion CNT3 may be positioned in the non-light emitting area NEA positioned around each light emitting area EA, but the positions of the second contact portion CNT2 and the third contact portion CNT3 may be changed according to embodiments. For example, the second contact portion CNT2 and the third contact portion CNT3 may be disposed to each light emitting area EA or separation area SPA.

At least one first light emitting element LD1 may be arranged between the first alignment electrode ALE1 and the second alignment electrode ALE2. For example, the first light emitting elements LD1 may be arranged between the first alignment electrode ALE1 and the second alignment electrode ALE2.

Each of the first light emitting elements LD1 may or may not overlap the first alignment electrode ALE1 and/or the second alignment electrode ALE2 in a plan view. The first end portion EP1 of the first light emitting element LD1 may be disposed to be adjacent to the first alignment electrode ALE1, and the second end portion EP2 of the first light emitting element LD1 may be disposed to be adjacent to the second alignment electrode ALE2.

The first end portion EP1 of the first light emitting element LD1 may be electrically connected to the first pixel electrode ELT1. In an embodiment, the first end EP1 of the first light emitting element LD1 may be electrically connected to the first alignment electrode ALE1 through the first pixel electrode ELT1, and may be electrically connected to the pixel circuit PXC and/or the first power line PL1 through the first alignment electrode ALE1.

The second end portion EP2 of the first light emitting element LD1 may be electrically connected to the intermediate electrode IET and/or the second pixel electrode ELT2. In an embodiment, the second end portion EP2 of the first light emitting element LD1 may be electrically connected to the intermediate electrode IET. The second end portion EP2 of the first light emitting element LD1 may be electrically connected to the second power line PL2 sequentially via the intermediate electrode IET, at least one second light emitting element LD2, the second pixel electrode ELT2, and the third alignment electrode ALE3.

At least one second light emitting element LD2 may be arranged between the first alignment electrode ALE1 and the third alignment electrode ALE3. For example, the second light emitting elements LD2 may be arranged between the first alignment electrode ALE1 and the third alignment electrode ALE3.

Each of the second light emitting elements LD2 may or may not overlap the first alignment electrode ALE1 and/or the third alignment electrode ALE3. The first end portion EP1 of the second light emitting element LD2 may be disposed to be adjacent to the first alignment electrode ALE1, and the second end portion EP2 of the second light emitting element LD2 may be disposed to be adjacent to the third alignment electrode ALE3.

The first end portion EP1 of the second light emitting element LD2 may be electrically connected to the intermediate electrode IET. The second end portion EP2 of the second light emitting element LD2 may be electrically connected to the second pixel electrode ELT2. In an embodiment, the second end portion EP2 of the second light emitting element LD2 may be electrically connected to the third alignment electrode ALE3 through the second pixel electrode ELT2, and may be electrically connected to the second power line PL2 through the third alignment electrode ALE3.

In an embodiment, each light emitting element LD may be an ultra-small inorganic light emitting element using a material having an inorganic crystalline structure (for example, having a small size in a range of nanometers to micrometers). For example, each light emitting element LD may be an ultra-small inorganic light emitting element manufactured by growing a nitride-based semiconductor and/or a phosphide-based semiconductor.

The light emitting elements LD may be prepared in a dispersed form in a solution to be supplied into each light emitting area EA through an inkjet method or a slit coating method and aligned between the alignment electrodes ALE by alignment signals applied to the alignment electrodes ALE (or alignment wires) of the pixels PX. After the light emitting elements LD are aligned, the solvent may be removed through a drying process or the like.

The first pixel electrode ELT1 may be disposed on the first end portions EP1 of the first light emitting elements LD1, and may be electrically connected to the first end portions EP1 of the first light emitting elements LD1. In an embodiment, the first pixel electrode ELT1 may overlap the first alignment electrode ALE1 in a plan view, and may be electrically connected to the first alignment electrode ALE1 through a fourth contact portion CNT4. The first pixel electrode ELT1 may be electrically connected to the pixel circuit PXC and/or the first power line PL1 of the corresponding pixel PX through the first alignment electrode ALE1. In another example, the first pixel electrode ELT1 may be electrically connected to the pixel circuit PXC and/or the first power line PL1 of the corresponding pixel PX without through the first alignment electrode ALE1.

The intermediate electrode IET may be disposed on the second end portions EP2 of the first light emitting elements LD1 and on the first end portions EP1 of the second light emitting elements LD2. The intermediate electrode IET may be electrically connected to the second end portions EP2 of the first light emitting elements LD1 and to the first end portions EP1 of the second light emitting elements LD2.

The second pixel electrode ELT2 may be disposed on the second end portions EP2 of the second light emitting elements LD2, and may be electrically connected to the second end portions EP2 of the second light emitting elements LD2. In an embodiment, the second pixel electrode ELT2 may overlap the third alignment electrode ALE3 in a plan view, and may be electrically connected to the third alignment electrode ALE3 through a fifth contact portion CNT5. The second pixel electrode ELT2 may be electrically connected to the second power line PL2 through the third alignment electrode ALE3. In another example, the second pixel electrode ELT2 may be electrically connected to the second power line PL2 without passing through the third alignment electrode ALE3.

The pixel electrodes (ELT) (for example, first pixel electrode ELT1, intermediate electrode IET, and second pixel electrode ELT2) may be at least formed in each light emitting area EA. In an embodiment, at least one pixel electrode ELT may extend from each light emitting area EA to the non-light emitting area NEA and/or the separation area SPA. For example, the first and second pixel electrodes ELT1 and ELT2 may extend from each light emitting area EA to the non-light emitting area NEA and the separation area SPA, and may be electrically connected to the first and third alignment electrodes ALE1 and ALE3 in the separation area SPA, respectively. The position, size, shape, and mutual disposition structure of the pixel electrodes ELT, and/or the positions of the fourth and fifth contact portions CNT4 and CNT5 may be variously changed according to embodiments.

The bank patterns BNP (also referred to as "patterns" or "wall patterns") may be disposed under the electrodes so that they overlap some of the electrodes disposed in the light emitting areas EA. For example, the bank patterns BNP may partially overlap the alignment electrodes ALE disposed in respective light emitting areas EA. In an embodiment, at least one bank pattern BNP may extend to the non-light emitting area NEA around the light emitting area EA.

In an embodiment, the bank patterns BNP may include an organic film. Accordingly, a height and/or thickness of bank patterns BNP may be easily controlled in the pixel process for forming the pixels PX.

The non-light emitting area NEA may be positioned around each light emitting area EA and/or each separation area SPA. The first bank BNK1 may be disposed in the non-light emitting area NEA.

The first bank BNK1 may include at least one first opening OPA1 corresponding to the light emitting area EA of each pixel group PXG, and may surround the light emitting area EA. By the first bank BNK1, it is possible to define and/or partition the light emitting area(s) EA of each pixel PX or each pixel group PXG. The first bank BNK1 may further include second openings OPA2 corresponding to the separation areas SPA, and may surround the separation areas SPA. For example, the first bank BNK1 may include openings OPA corresponding to each light emitting area EA and each separation area SPA.

In an embodiment, the first bank BNK1, as shown in FIG. 6, may individually surround the first, second and third light emitting areas EA1, EA2, and EA3, and may include separate-type first openings OPA1 respectively corresponding to the first, second, and third light emitting areas EA1, EA2, and EA3. For example, a portion of the first bank BNK1 may be disposed between the first, second, and third light emitting areas EA1, EA2, and EA3.

In another example, the first bank BNK1 may include, as shown in FIG. 7, the first opening OPA1 integrally formed to include all of the light emitting areas EA (for example, the first, second, and third light emitting areas EA1, EA2, EA3) corresponding to the pixels PX of each pixel group PXG. For example, the first bank BNK1 may be opened to include all of the light emitting areas EA of each pixel group PXG. The area and/or volume of the light emitting area EA corresponding to each pixel group PXG may be increased.

The first bank BNK1 may include at least one light blocking and/or reflective material. For example, the first bank BNK1 may include at least one of a black matrix material and/or a color filter material of a specific color.

In an embodiment, the first bank BNK1 may include an organic film. Accordingly, a height and/or thickness of the first bank BNK1 may be easily controlled in the pixel process for forming the pixels PX.

In an embodiment, the first bank BNK1 may include a hydrophobic surface. For example, the first bank BNK1 itself may be formed in a hydrophobic pattern by using a hydrophobic material, or a hydrophobic film made of a hydrophobic material may be formed on the first bank BNK1. For example, the first bank BNK1 is formed by using a hydrophobic organic insulating material having a large contact angle, such as polyacrylate, so that the first bank BNK1 may be formed in a hydrophobic organic film pattern. Accordingly, the light emitting element ink may stably flow into the light emitting areas EA.

FIG. 8 to FIG. 13 illustrate schematic cross-sectional views of the display panel DP according to the embodiments. For example, FIG. 8 to FIG. 13 illustrate cross-sectional views of the display panel DP taken along a line II-II' of FIG. 6 according to embodiments.

Figure 11:
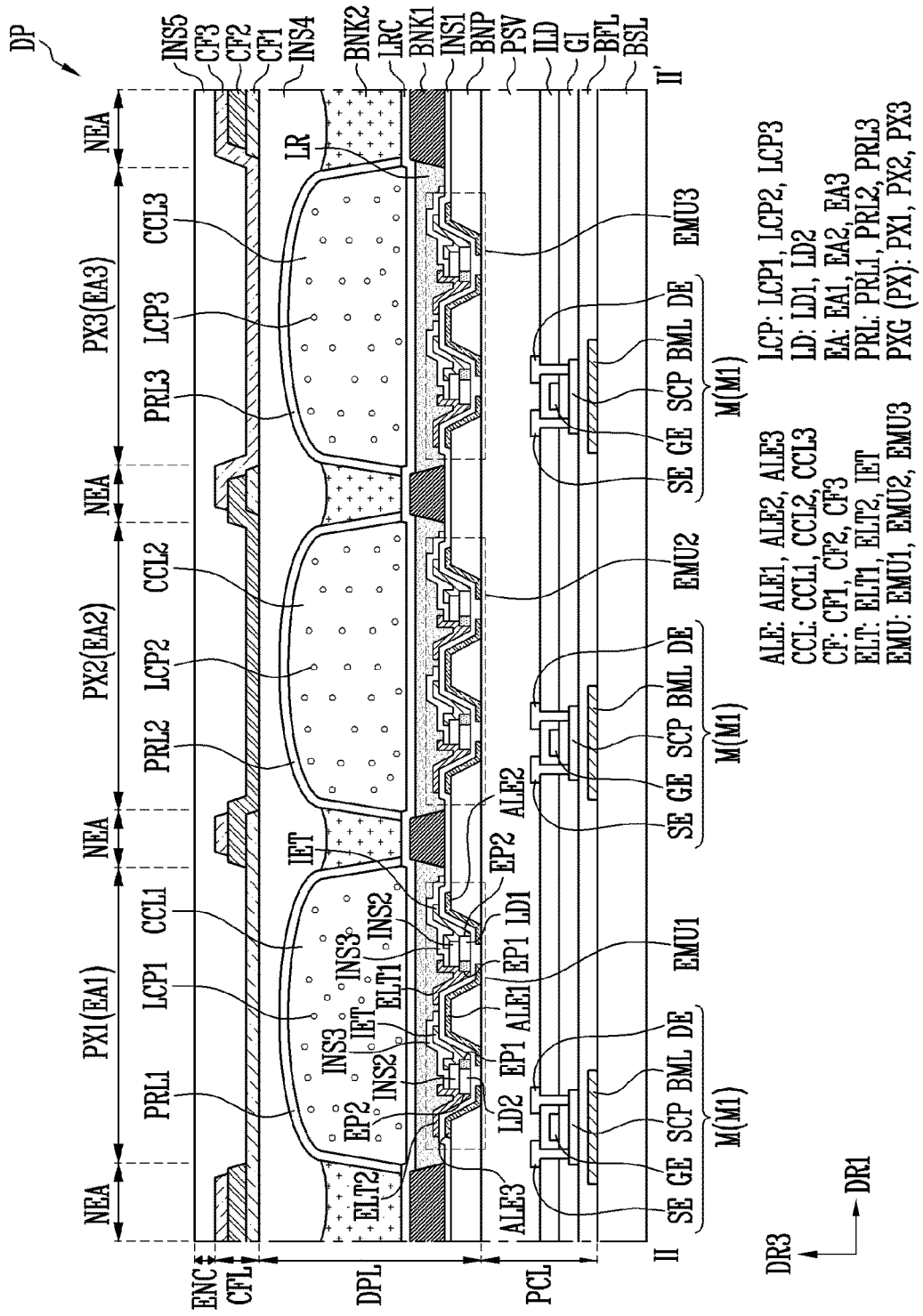
Figure 12:
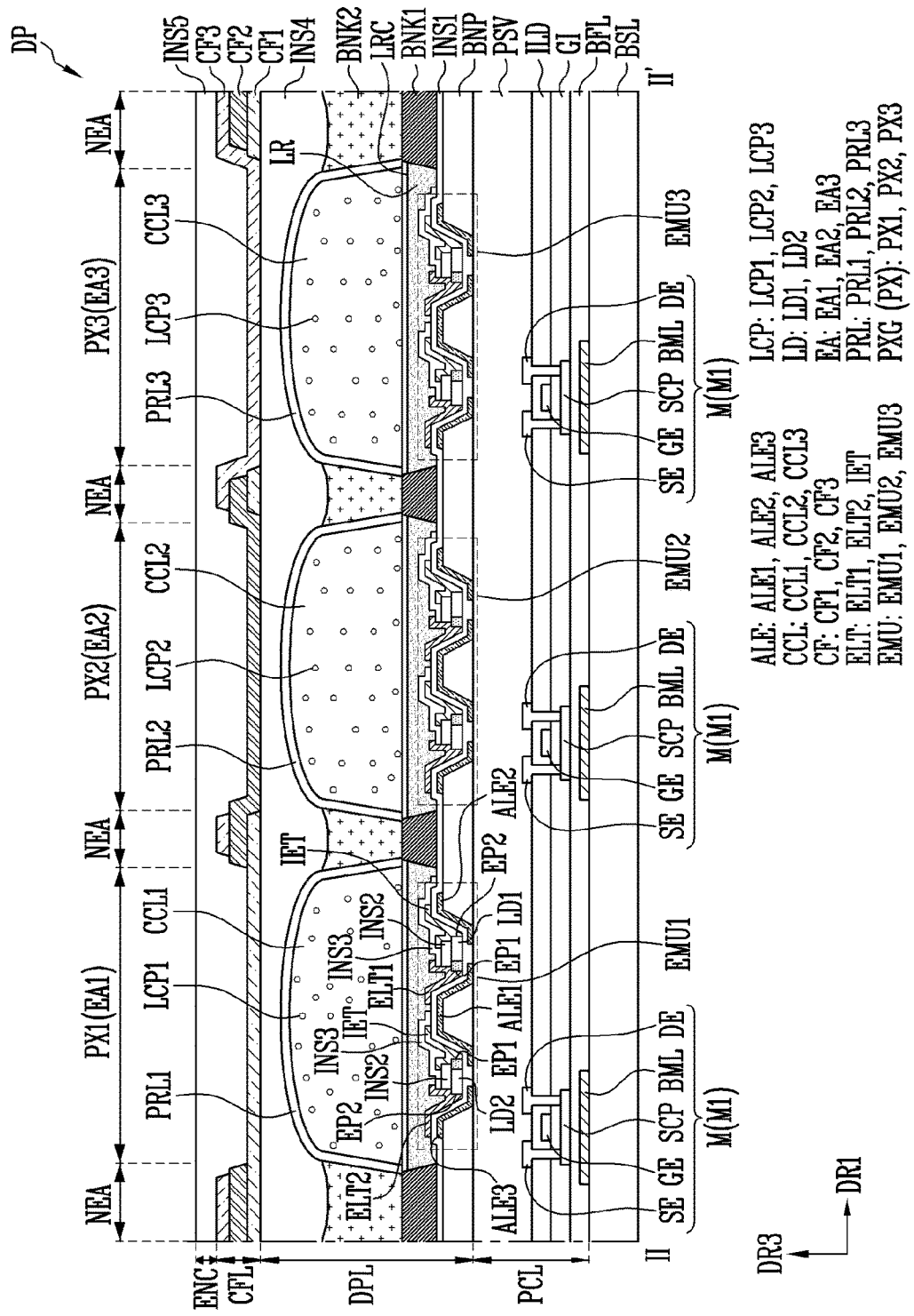
Figure 13:
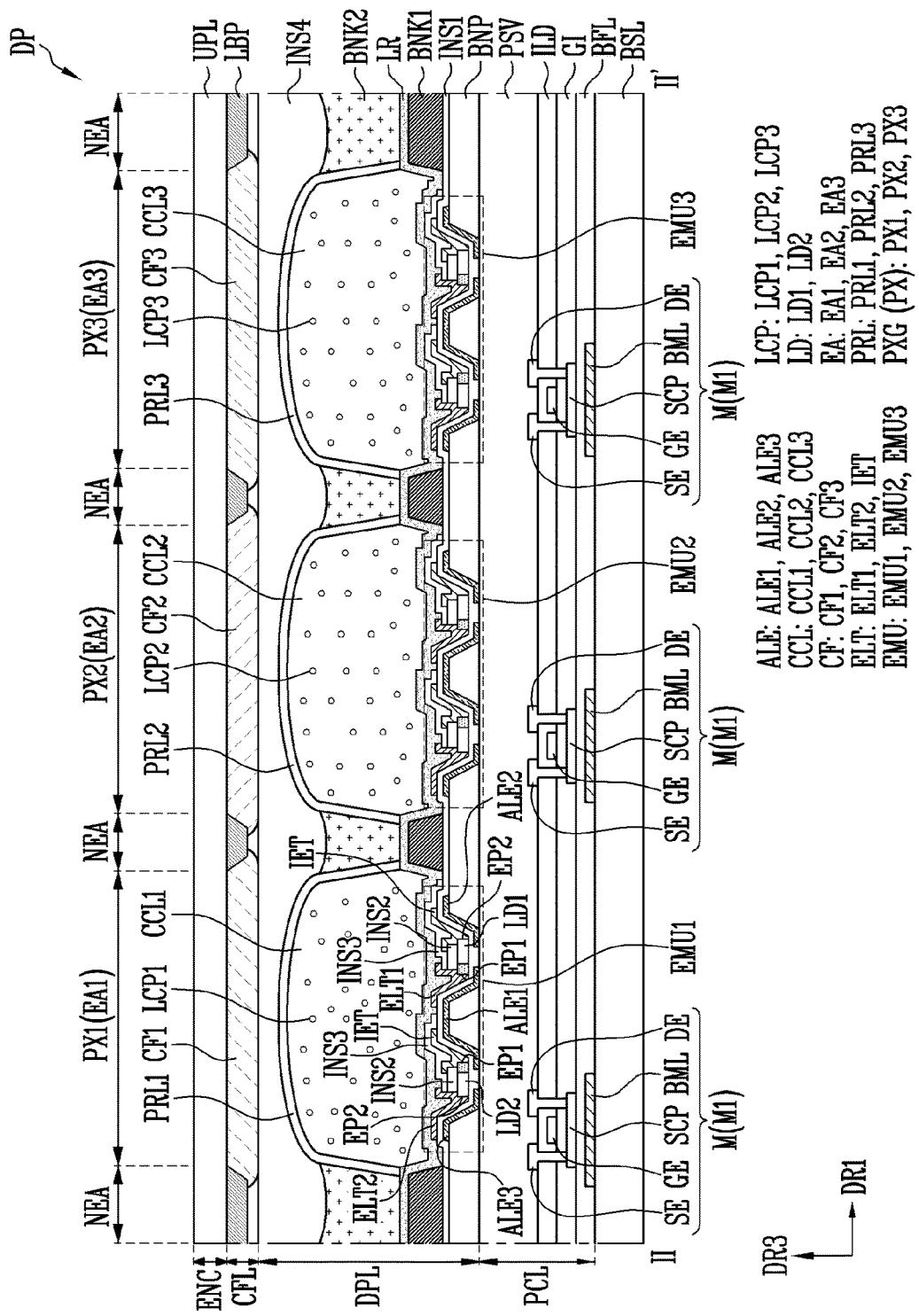

In the embodiments of FIGS. 8 to 12, a first layer LR and/or a second layer LRC may be provided between the light emitting part EMU and the light conversion layer CCL of each pixel PX. In FIG. 13, a color filter layer CFL and an encapsulation layer ENC may be modified compared to FIG. 8. In FIGS. 8 to 13, the same reference numerals represent the same or similar constituent elements, and repeated descriptions will be omitted.

Referring to FIGS. 8 to 13, a display panel DP may include a base layer BSL (also referred to as a "first substrate" or "lower substrate"), a pixel circuit layer PCL (also referred to as a "circuit element layer" or "circuit layer"), and a display element layer DPL (also referred to as a "light emitting element layer" or "display layer"). The pixel circuit layer PCL and the display element layer DPL may be disposed to overlap each other on the base layer BSL. For example, the pixel circuit layer PCL and the display element layer DPL may be sequentially disposed on the base layer BSL.

The display panel DP may further include the color filter layer CFL and/or the encapsulation layer ENC (or a protective film) disposed on the display element layer DPL. In an embodiment, the color filter layer CFL and/or the encapsulation layer ENC may be directly formed on one surface of the base layer BSL on which the pixel circuit layer PCL and the display element layer DPL are formed.

The base layer BSL may be a rigid substrate or a flexible film-type substrate. The base layer BSL may be a single-layered or multi-layered substrate or film.

The pixel circuit layer PCL may be provided on one surface of the base layer BSL. The pixel circuit layer PCL may include circuit elements configuring the pixel circuits PXC of the pixels PX. For example, the pixel circuit layer PCL may include the pixel circuits PXC of the first, second, and third pixels PX1, PX2, and PX3 formed in each unit pixel area corresponding to each pixel group PXG. The pixel circuits PXC may include respective circuit elements. FIGS. 8 to 13 illustrate the first transistors M1 included in the pixel circuits PXC, as an example of circuit elements that may be disposed in the pixel circuit layer PCL. Each of the first transistors M1 may be electrically connected to at least one electrode (for example, the first alignment electrode ALE1 and/or the first pixel electrode ELT1) configuring the light emitting part EMU of each pixel PX through the first contact portion CNT1 of FIG. 6 and FIG. 7.

The pixel circuit layer PCL may further include wires electrically connected to the pixels PX. For example, the pixel circuit layer PCL may include the scan lines SL, the data lines DL, the sensing lines SENL, the first power line PL1, and/or a second power line PL2.

The pixel circuit layer PCL may further include insulating layers. For example, the pixel circuit layer PCL may include a buffer layer BFL, a gate insulating layer GI, an interlayer insulating layer ILD, and/or a passivation layer PSV, sequentially disposed on a surface of the base layer BSL.

The pixel circuit layer PCL may include a first conductive layer disposed on the base layer BSL and that includes the bottom metal layers BML of the first transistors M1. For example, the first conductive layer may be disposed between the base layer BSL and the buffer layer BFL, and may include lower metal layers BML of the first transistors M1 included in the pixels PX. The bottom metal layers BML of the first transistors M1 may overlap gate electrodes GE and semiconductor patterns SCP of the first transistors M1 in a plan view.

The first conductive layer may further include at least one wire. For example, the first conductive layer may include at least some of wires extending in the second direction DR2 in the display panel DP.

The buffer layer BFL may be disposed on one surface of the base layer BSL including the first conductive layer. The buffer layer BFL may prevent impurities from diffusing into each circuit element.

A semiconductor layer may be disposed on the buffer layer BFL. The semiconductor layer may include semiconductor patterns SCP of the transistors M. Each semiconductor pattern SCP may include a channel area overlapping the gate electrode GE of the corresponding transistor M in a plan view, and first and second conductive areas (for example, source and drain areas) disposed at both sides of the channel area.

The gate insulating layer GI may be disposed on the semiconductor layer. A second conductive layer may be disposed on the gate insulating layer GI.

The second conductive layer may include the gate electrodes GE of the transistors M. The second conductive layer may further include an electrode, at least one wire, and/or a bridge pattern of each of capacitors Cst provided in the pixel circuits PXC.

The interlayer insulating layer ILD may be disposed on the second conductive layer. A third conductive layer may be disposed on the interlayer insulating layer ILD.

The third conductive layer may include source electrodes SE and drain electrodes DE of the transistors M. Each source electrode SE may be electrically connected to an area (for example, a source area) of the semiconductor pattern SCP included in the corresponding transistor M through at least one contact hole, and each drain electrode DE may be electrically connected to another area (for example, a drain area) of the semiconductor pattern SCP included in the corresponding transistor M through at least one other contact hole. The third conductive layer may further include another electrode, at least one wire (for example, at least some of wires extending in the first direction DR1 in the display panel DP), and/or a bridge pattern of each of the capacitors Cst provided in the pixel circuits PXC.

Each of the conductive pattern, the electrode, and/or the wire configuring the first to third conductive layers may have conductivity by including at least one conductive material, but the configuration material is not particularly limited. For example, each of the conductive pattern, the electrode, and/or the wire configuring the first to third conductive layers may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), or may include various types of conductive materials.

The passivation layer PSV may be disposed on the third conductive layer. Each of the buffer layer BFL, the gate insulating layer GI, the interlayer insulating layer ILD, and the passivation layer PSV may be a single layer or multi-layer, and may include an inorganic insulating material and/or an organic insulating material. For example, each of the buffer layer BFL, the gate insulating layer GI, the interlayer insulating layer ILD, and the passivation layer PSV may include various types of inorganic insulating materials such as a silicon nitride ($SiN_x$), a silicon oxide ($SiO_x$), or a silicon oxynitride (SiOxNy). In an embodiment, the passivation layer PSV may include an organic film including an organic insulating material, and may planarize a surface of the pixel circuit layer PCL.

The display element layer DPL may be disposed on the passivation layer PSV.

The display element layer DPL may include the light emitting parts EMU of the pixels PX. For example, the display element layer DPL includes the alignment electrodes ALE, the light emitting elements LD, the pixel electrodes ELT, and at least one insulating layer, and/or the insulating patterns included in the light emitting part EMU of each pixel PX. The at least one insulating layer and/or the insulating patterns may include bank patterns BNP, and a first insulating layer INS1, a second insulating layer INS2, and/or third insulating layer INS3. The display element layer DPL may further include a first bank BNK1, a second bank BNK2, light conversion layers CCL, protective layers PRL, and/or a fourth insulating layer INS4.

The bank patterns BNP may be provided and/or formed on the passivation layer PSV. The bank patterns BNP may respectively overlap at least one alignment electrode ALE, and may be sequentially arranged along the first direction DR1 in each light emitting area EA.

A portion of each of the alignment electrodes ALE may protrude in an upper direction (for example, the third direction DR3) around the light emitting elements LD by the bank patterns BNP. A reflective protruding pattern around the light emitting elements LD may be formed by the bank patterns BNP and the alignment electrodes ALE thereon. Accordingly, the light efficiency of the pixels PX may be increased.

The bank patterns BNP may be single-layered or multi-layered patterns including an inorganic film (for example, an inorganic insulating film) made of an inorganic material and/or an organic film (for example, an organic insulating film) made of an organic material. For example, the bank patterns BNP may include at least organic films. Accordingly, the bank patterns BNP may be easily formed to have an appropriate height (for example, a height required to form a reflective protruding pattern). The alignment electrodes ALE of the light emitting parts EMU (for example, the first, second and third alignment electrodes ALE1, ALE2, and ALE3 configuring each light emitting part EMU) may be formed on the bank patterns BNP.

The alignment electrodes ALE may include conductive materials. For example, the alignment electrodes ALE may include at least one metal including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same, a conductive oxide such as an indium tin oxide (ITO), an indium zinc oxide (IZO), an indium tin zinc Oxide (ITZO), a zinc oxide (ZnO), an aluminum doped zinc oxide (AZO), a gallium doped zinc oxide (GZO), a zinc tin oxide (ZTO), a gallium tin oxide (GTO), and a fluorine doped tin oxide (FTO), and at least one conductive polymers such as PEDOT. The alignment electrodes ALE may include other conductive materials in addition to a carbon nanotube or graphene. For example, the alignment electrodes ALE may have conductivity by including at least one conductive material, but the material is not particularly limited. The alignment electrodes ALE may include conductive materials that are the same as or different from each other.

Each of the alignment electrodes ALE may be configured of a single layer or multilayer. For example, each alignment electrode ALE may include a reflective electrode layer including a reflective conductive material (for example, metal). Each alignment electrode ALE may optionally further include at least one of a transparent electrode layer disposed at upper and/or lower portions of the reflective electrode layer and a conductive capping layer covering upper portions of the reflective electrode layer and/or the transparent electrode layer.

The first insulating layer INS1 may be disposed on the alignment electrodes ALE. In an embodiment, the first insulating layer INS1 may include contact portions (for example, the fourth and fifth contact portions CNT4 and CNT5 in FIG. 6 and FIG. 7) for electrically connecting the first and third alignment electrodes ALE1 and ALE3 to the first and second pixel electrodes ELT1 and ELT2, respectively. In another example, the first insulating layer INS1 may be formed over the entire display panel DP in which the alignment electrodes ALE are formed, and may include openings exposing a portion of each of the first and third alignment electrodes ALE1 and ALE3. The first and third alignment electrodes ALE1 and ALE3 may be electrically connected to the first and second pixel electrodes ELT1 and ELT2, respectively, in an area in which respective contact portions are formed in the first insulating layer INS1 (or in an area in which the first insulating layer INS1 is opened). The first insulating layer INS1 may be locally disposed only in a lower portion of an area in which the light emitting elements LD are arranged.

The first insulating layer INS1 may include an inorganic insulating film including an inorganic insulating material and/or an organic insulating film including an organic insulating material. In an embodiment, the first insulating layer INS1 may include a silicon nitride ($SiN_x$), a silicon oxide ($SiO_x$), a silicon oxynitride ($SiO_xN_y$), or other inorganic insulating materials. The first insulating layer INS1 may be a single layer or multilayer.

As the alignment electrodes ALE are covered by the first insulating layer INS1, it is possible to prevent the alignment electrodes ALE from being damaged in a subsequent process. It is possible to secure electrical stability of the alignment electrodes ALE.

The first bank BNK1 may be disposed on one surface of the base layer BSL on which the alignment electrodes ALE and the first insulating layer INS1 are formed. An area (for example, the light emitting area EA of each pixel PX or each pixel group PXG) to which the light emitting elements LD are to be supplied may be defined by the first bank BNK1.

The light emitting elements LD may be supplied in each light emitting area EA. The light emitting elements LD may be disposed on the first insulating layer INS1, and may be aligned between the alignment electrodes ALE by alignment signals applied to the alignment electrodes ALE (or alignment wires).

In an embodiment, the light emitting elements LD arranged in the light emitting areas EA of the pixels PX may be light emitting elements of the same color as each other. For example, the first, second, and third pixels PX1, PX2, and PX3 may equally include the light emitting elements LD of the third color (for example, blue light emitting elements). A first light conversion layer CCL1 including first light conversion particles LCP1 corresponding to a first color (for example, red) may be disposed on the light emitting elements LD of the first pixel PX1, and a second light conversion layer CCL2 including second light conversion particles LCP2 corresponding to a second color (for example, green) may be disposed on the light emitting elements LD of the second pixel PX2. Accordingly, the first pixel PX1 may emit light of the first color, and the second pixel PX2 may emit light of the second color.

The second insulating layer INS2 (also referred to as an "insulating pattern") may be disposed on some of the light emitting elements LD. In an embodiment, the second insulating layer INS2 may be disposed on a portion including a central portion of the light emitting elements LD so as to expose the first and second end portions EP1 and EP2 of each of the light emitting elements LD aligned between a pair of alignment electrodes ALE. In another example, the second insulating layer INS2 is formed over the entire pixel areas in which respective light emitting elements LD are disposed, and may be partially opened in areas including the upper portions of the first and second end portions EP1 and EP2 of the light emitting elements LD as needed. When the second insulating layer INS2 is formed on the light emitting elements LD, the light emitting elements LD may be stably fixed, and the pixel electrodes ELT that are disposed on the first and second end portions EP1 and EP2 of the light emitting elements LD may be stably separated.

The second insulating layer INS2 may include an inorganic insulating film including an inorganic insulating material and/or an organic insulating film including an organic insulating material. For example, the second insulating layer INS2 may include a silicon nitride ($SiN_x$), a silicon oxide ($SiO_x$), a silicon oxynitride ($SiO_xN_y$), an aluminum oxide ($Al_xO_y$), a photo resist (PR) material, or other insulating materials. The second insulating layer INS2 may be a single layer or multilayer.

The pixel electrodes ELT (for example, first pixel electrode ELT1, second pixel electrode ELT2, and intermediate electrode IET) may be disposed on the first and second end portions EP1 and EP2 of the light emitting elements LD. For example, the first pixel electrode ELT1 may be disposed on the first end portion EP1 of the first light emitting element LD1, and the intermediate electrode IET may be disposed on the second end portion EP2 of the first light emitting element LD1. The intermediate electrode IET may be disposed on the first end portion EP1 of the second light emitting element LD2, and the second pixel electrode ELT2 may be disposed on the second end portion EP2 of the second light emitting element LD2.

In an embodiment, the first pixel electrode ELT1 may be electrically connected to the first end portion EP1 of the first light emitting element LD1 by contacting (e.g., directly contacting) the first end portion EP1 of the first light emitting element LD1. The second pixel electrode ELT2 may be electrically connected to the second end portion EP2 of the second light emitting element LD2 by contacting (e.g., directly contacting) the second end portion EP2 of the second light emitting element LD2. The intermediate electrode IET may be electrically connected between the first light emitting element LD1 and the second light emitting element LD2 by contacting the second end portion EP2 of the first light emitting element LD1 and the first end portion EP1 of the second light emitting element LD2. A connection structure between the pixel electrodes ELT and the light emitting elements LD may be changed according to embodiments.

The pixel electrodes ELT may be disposed on the same layer or different layers. In an embodiment, a pair of pixel electrodes ELT disposed on the first end portion EP1 and second end portion EP2 of each of the light emitting elements LD may be disposed on different layers, and the third insulating layer INS3 may be disposed between the pair of pixel electrodes ELT. For example, the third insulating layer INS3 may be disposed on one pixel electrode ELT of the pair of pixel electrodes ELT, and one end portion thereof may be interposed between the pair of pixel electrodes ELT. For example, the intermediate electrode IET may be formed on a different layer from the first and second pixel electrodes ELT1 and ELT2, and the third insulating layer INS3 may be disposed between the intermediate electrode IET and the first pixel electrode ELT1 and between the intermediate electrode IET and the second pixel electrode ELT2. The first pixel electrode ELT1 and the second pixel electrode ELT2 may be formed on the same layer or different layers. In another example, the pixel electrodes ELT may all be formed on the same layer, and the pixel PX may not include the third insulating layer INS3.

In an embodiment, the pixel PX may not include the intermediate electrode IET. For example, when the light emitting part EMU of each pixel PX includes only a single light emitting element LD or is formed to have an in-parallel structure as in an embodiment of FIG. 4, the pixel PX may not include the intermediate electrode IET. The first pixel electrode ELT1 may be disposed on the first end portions EP1 of the light emitting elements LD, and the second pixel electrode ELT2 may be disposed on the second end portions EP2 of the light emitting elements LD. The number, position, and/or formation order of the pixel electrodes ELT provided to each pixel PX may vary according to embodiments.

The pixel electrodes ELT may have conductivity by including a conductive material. In an embodiment, the pixel electrodes ELT may include a transparent conductive material, and may be formed to be substantially transparent so that light emitted from the light emitting elements LD may transmit therethrough.

The third insulating layer INS3 may include an inorganic insulating film including an inorganic insulating material and/or an organic insulating film including an organic insulating material. In an embodiment, the third insulating layer INS3 may include a silicon nitride ($SiN_x$), a silicon oxide ($SiO_x$), a silicon oxynitride ($SiO_xN_y$), or other inorganic insulating materials. The third insulating layer INS3 may be a single layer or multilayer.

The bank patterns BNP, the alignment electrodes ALE, the first insulating layer INS1, at least one light emitting element LD, the second insulating layer INS2, the pixel electrodes ELT, and/or the third insulating layer INS3, which are provided in the light emitting area EA of each pixel PX, may configure the light emitting part EMU of the corresponding pixel PX. Each of the light conversion layers CCL may be provided on each of the light emitting parts EMU, and the first layer LR may be provided between the light emitting parts EMU and the light conversion layers CCL. The second layer LRC may be selectively provided on the first layer LR.

The first layer LR may be disposed on the light emitting parts EMU of the pixels PX, and may be provided on at least the light emitting areas EA. For example, the first layer LR may be disposed in each of the light emitting areas EA so as to entirely cover each of the light emitting parts EMU.

The first layer LR may be disposed between the light emitting part EMU and the light conversion layer CCL of each pixel PX to separate the light emitting part EMU and the light conversion layer CCL from each other. Accordingly, deterioration of the light conversion layer CCL (for example, deterioration of the light conversion particles LCP (for example, quantum dots) provided in each light conversion layer CCL) may be reduced or prevented by protecting the light conversion layer CCL from heat and light generated by the light emitting part EMU. Accordingly, reliability of the pixel PX may be improved.

The first layer LR may be a low refractive layer and/or a light scattering layer (or a scatterer layer). For example, the first layer LR may be a low refractive layer having a refractive index equal to or less than that of at least one insulating layer provided to the light emitting parts EMU.

In an embodiment, the first layer LR may contact (for example, directly contact) a portion of the first insulating layer INS1. For example, the first layer LR may directly contact the first insulating layer INS1 in edge areas of the light emitting areas EA adjacent to the first bank BNK1. The first layer LR may have a refractive index equal to or less than a refractive index of the first insulating layer INS1. For example, the first insulating layer INS1 may be formed of a silicon oxide ($SiO_x$) having a refractive index of about 1.3 to about 1.5 (for example, a refractive index of about 1.35 to about 1.48), and the first layer LR may be formed of a silicon oxide ($SiO_x$), a silicon oxynitride ($SiO_xN_y$), or other inorganic or organic insulating material having a refractive index less than or equal to that of the first insulating layer INS1 (for example, a refractive index of about 1.45 or less).

In an embodiment in which the pixel PX includes the third insulating layer INS3, the first layer LR may contact (for example, directly contact) a portion of the third insulating layer INS3. For example, the first layer LR may directly contact the third insulating layer INS3 on an upper portion of the intermediate electrode IET. When the formation order of the intermediate electrode IET and the first and second pixel electrodes ELT1 and ELT2 is reversed, the third insulating layer INS3 may be disposed on the first and second pixel electrodes ELT1 and ELT2, and the first layer LR and the third insulating layer INS3 may directly contact each other on the first and second pixel electrodes ELT1 and ELT2. When the pixel PX does not include the intermediate electrode IET, the third insulating layer INS3 may be disposed on one of the first and second pixel electrodes ELT1 and ELT2, and the first layer LR and the third insulating layer INS3 may directly contact each other on one of the first and second pixel electrodes ELT1 and ELT2. The first layer LR may have a refractive index equal to or less than a refractive index of the third insulating layer INS3. For example, the third insulating layer INS3 may be formed of a silicon nitride ($SiN_x$), a silicon oxide ($SiO_x$), or a silicon oxynitride ($SiO_xN_y$) having a refractive index of about 1.3 to about 1.8 (for example, a refractive index of about 1.5 to about 1.8), and the first layer LR may be formed of a silicon oxide ($SiO_x$), a silicon oxynitride ($SiO_xN_y$), or other inorganic or organic insulating material having a refractive index less than or equal to that of the third insulating layer INS3 (for example, a refractive index of about 1.45 or less).

When the first layer LR has a refractive index equal to or less than that of at least one insulating layer (for example, the first insulating layer INS1 and/or the third insulating layer INS3) contacting it at a lower portion thereof, by improving a light output characteristic (for example, a light output angle and/or light output profile) of each pixel PX, light efficiency of the pixel PX may be improved. For example, by forming the first layer LR as a low refractive layer, among light generated by each light emitting part EMU, a ratio of light directed toward a front direction (for example, an upper direction included in a viewing angle range including the third direction DR3) of the display panel DP may be increased. Accordingly, an amount of light incident on each light conversion layer CCL may be increased, and thus the light efficiency of the pixel PX may be improved.

In an embodiment, the first layer LR may include a light scattering layer. For example, the first layer LR may be formed as a light scattering layer disposed to entirely cover each light emitting area EA provided with each light emitting part EMU and that includes light scattering particles (for example, silica particles) dispersed in a transparent material (for example, a resin layer), or may include the light scattering layer. Accordingly, it is possible to increase a utilization rate of light generated by each light emitting part EMU to improve the light efficiency of the pixel PX.

In some embodiments, the first layer LR may include an inorganic film provided in the at least light emitting areas EA. For example, the first layer LR may include an inorganic film entirely covering the light emitting area EA of each pixel PX as shown in FIG. 8 and FIG. 9.

Figure 8:
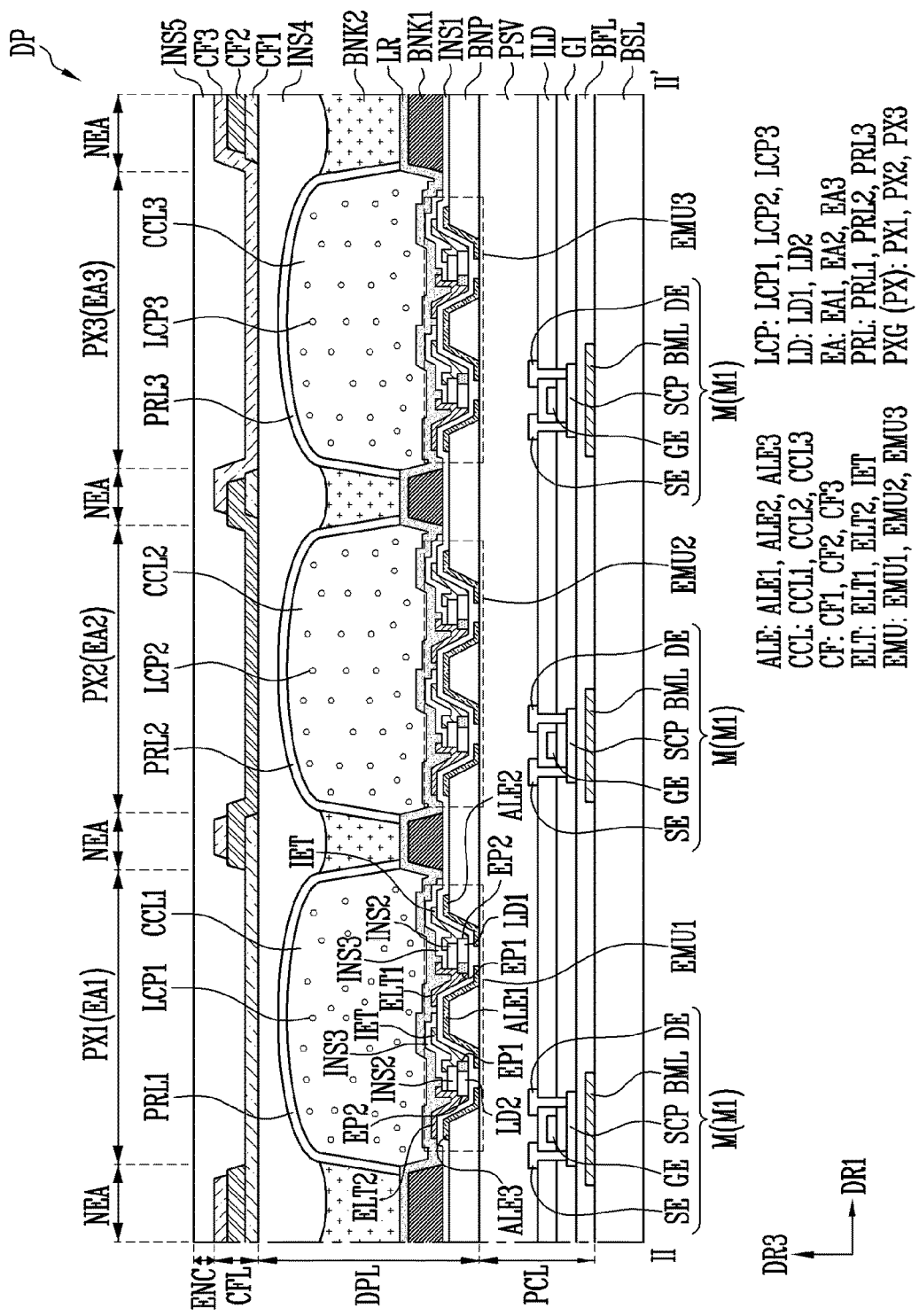
FIG. 8 to FIG. 13 illustrate schematic cross-sectional views of a display panel according to embodiments.

In an embodiment, the first layer LR may be formed as an inorganic film disposed over the entire display area DA including each of the light emitting areas EA as shown in FIG. 8, or may include the inorganic film. In an embodiment, when forming an outgassing passage in the non-light emitting area NEA in which the first bank BNK1 and the like are disposed, the first layer LR may be partially removed in an area for forming the outgassing passage.

Figure 9:
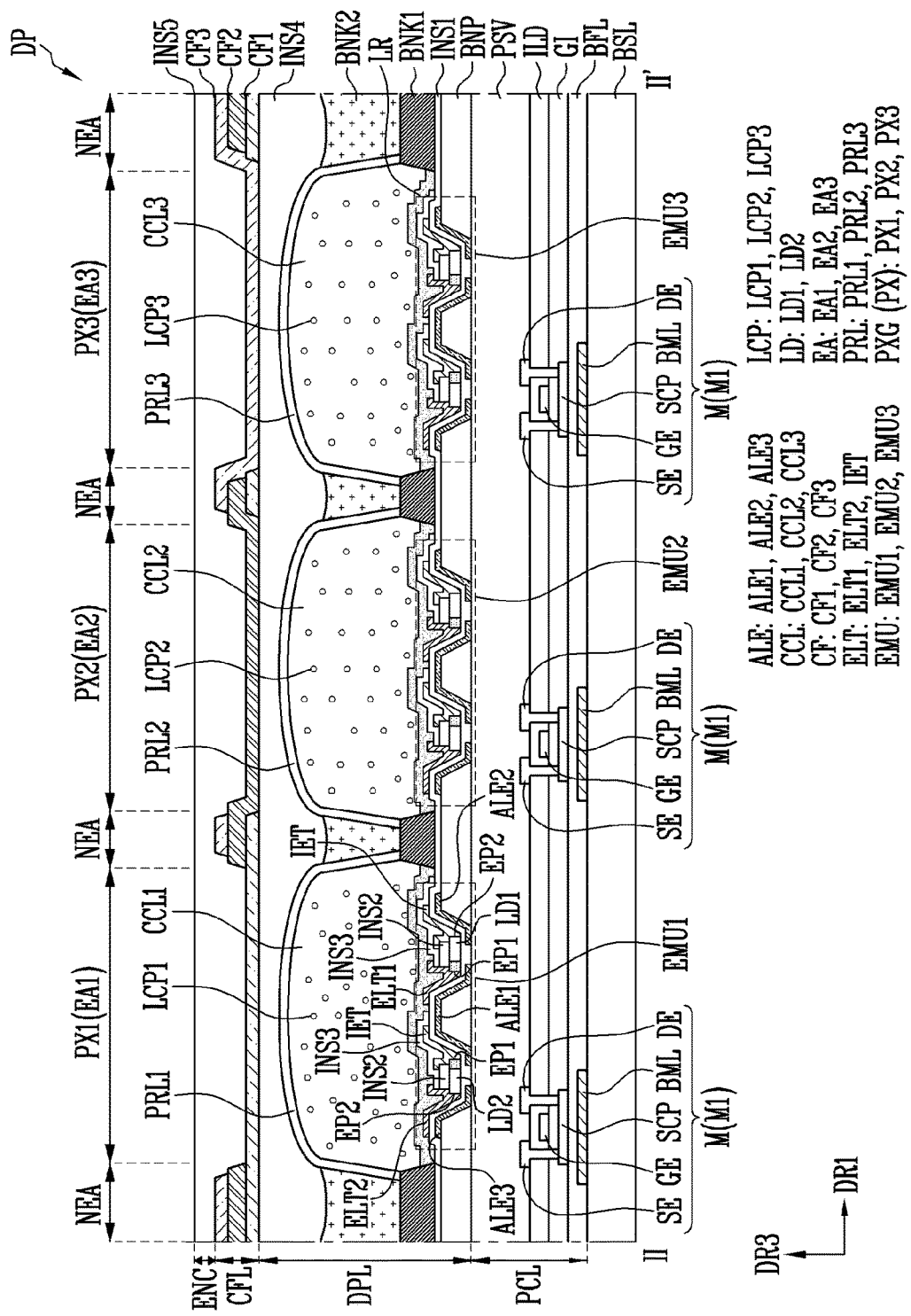

In an embodiment, the first layer LR may be formed as an inorganic film individually patterned corresponding to each of the light emitting areas EA as shown in FIG. 9, or may include the inorganic film. For example, the first layer LR may be disposed to entirely cover each of the light emitting areas EA, but may not be provided in the non-light emitting area NEA. Only organic films (for example, the second bank BNK2, the fourth insulating layer INS4, the color filters CF, and/or the fifth insulating layer INS5) on an upper portion of the first bank BNK1 may be sequentially disposed to substantially form the outgassing passage.

Figure 10:
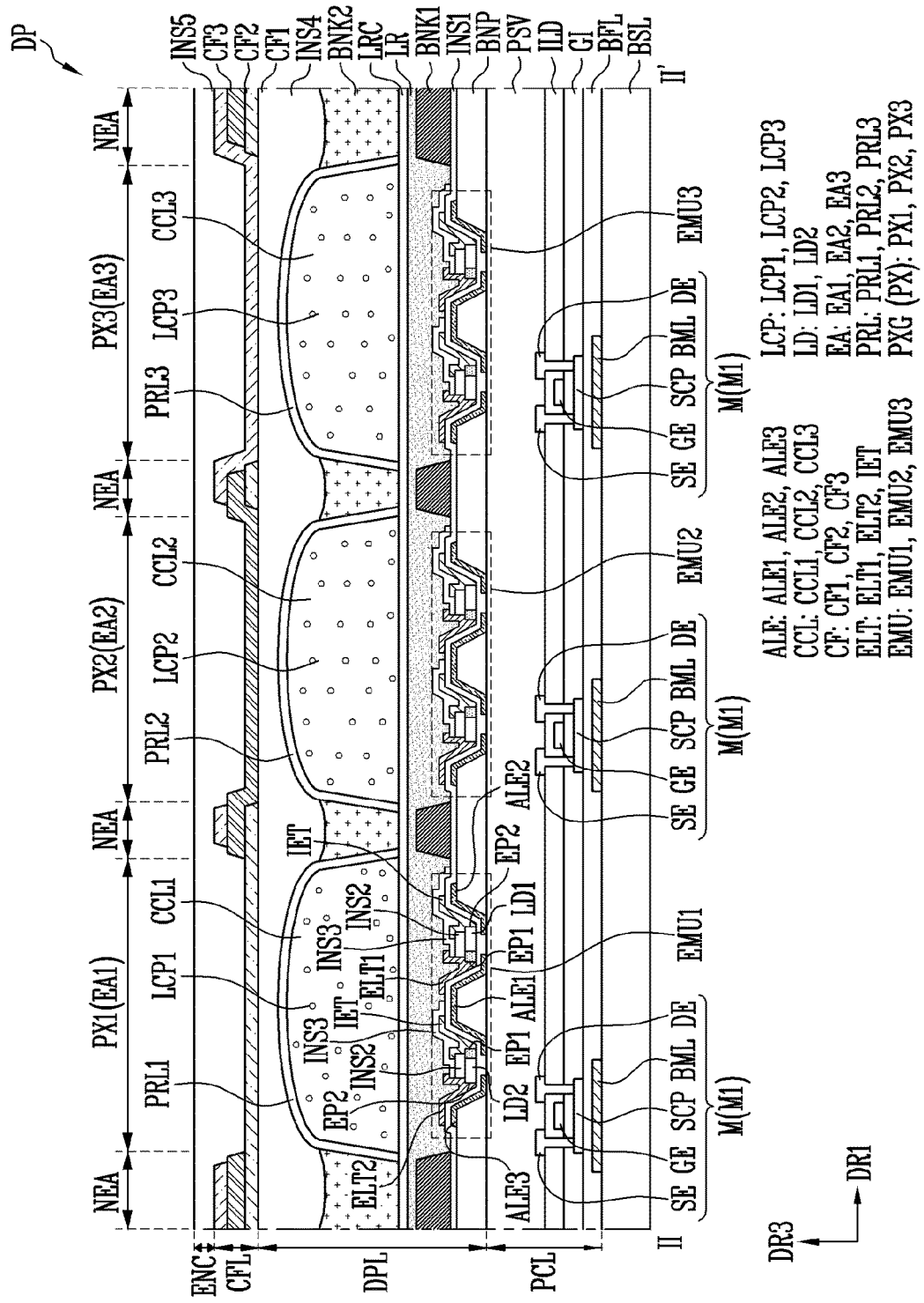

In some embodiments, the first layer LR may include an organic layer (for example, a transparent resin layer) provided in at least light emitting areas EA. For example, the first layer LR may include an organic film disposed in the entire light emitting area EA of each pixel PX as shown in FIG. 10 to FIG. 12, and may flatten an upper portion of each of the light emitting parts EMU. When the first layer LR includes an organic layer, the first layer LR may be easily formed to have an appropriate height and/or thickness (for example, a height and/or thickness sufficient to separate the light emitting part EMU from the light conversion layer CCL in order to reduce or prevent deterioration of the light conversion layer CCL).

In an embodiment, the first layer LR may be a porous organic film including light scattering particles. For example, the first layer LR may be a porous organic film including a resin layer and hollow particles dispersed inside the resin layer, and may have a refractive index in a range of about 1.1 to about 1.3. The hollow particles may mean particles in a form in which empty spaces exist on surfaces and/or inside of organic or inorganic particles. The hollow particles may be hollow silica particles. The "hollow silica particles" are silica particles derived from a silicon compound or an organosilicon compound, and may be particles in a form in which empty spaces exist on surfaces and/or inside of the silica particles.

When the first layer LR includes an organic film, the second layer LRC (for example, a "protective layer" or a "capping layer") including an inorganic film may be further provided on an upper portion of the first layer LR. For example, the second layer LRC may be directly disposed on the first layer LR to cover the upper portion of the first layer LR, and may be disposed between the first layer LR and the light conversion layers CCL. In an embodiment, the second layer LRC may be a single-layered or multi-layered inorganic film made of a silicon nitride ($SiN_x$), a silicon oxide ($SiO_x$), a silicon oxynitride ($SiO_xN_y$), an aluminum oxide ($AlO_x$), or another inorganic insulating material.

The second layer LRC may be disposed on the entire upper portion of the first layer LR in at least the light emitting areas EA to protect the second layer LRC. The second layer LRC may protect the light conversion layers CCL from outgassing that may occur in the first layer LR.

In an embodiment, the first layer LR may be formed as an organic film disposed over the entire display area DA including each of the light emitting areas EA as shown in FIG. 10, or may include the organic film. The second layer LRC may be disposed over the entire display area DA to cover the first layer LR. In an embodiment, when forming an outgassing passage in the non-light emitting area NEA in which the first bank BNK1 and the like are disposed, the second layer LRC may be partially removed in an area for forming the outgassing passage.

In an embodiment, the first layer LR may be formed as an organic film individually patterned corresponding to each of the light emitting areas EA as shown in FIG. 11 and FIG. 12, or may include the organic film. For example, the first layer LR may be disposed over the entire area of each of the light emitting areas EA, but may not be provided in the non-light emitting area NEA. The second layer LRC, as shown in FIG. 11, may be disposed over the entire display area DA to cover the first layer LR and the first bank BNK1. In an embodiment, it is also possible to partially remove the second layer LRC on an upper portion of the first bank BNK1 to form an outgassing passage. The second layer LRC may be formed as an inorganic film individually patterned corresponding to each of the light emitting areas EA as shown in FIG. 12, or may include the inorganic film. Only organic films may be sequentially disposed on the upper portion of the first bank BNK1 to properly form the outgassing passage.

The light conversion layers CCL may be provided in each of the light emitting areas EA to be positioned on each of the light emitting parts EMU. For example, the light conversion layers CCL may include the first light conversion layer CCL1 provided in the first light emitting area EA1 to be positioned on the first light emitting part EMU1, the second light conversion layer CCL2 provided in the second light emitting area EA2 to be positioned on the second light emitting part EMU2, and/or the third light conversion layer CCL3 provided in the third light emitting area EA3 to be positioned on the third light emitting part EMU3.

The light conversion layers CCL may include respective light conversion particles LCP. For example, each light conversion layer CCL may include wavelength conversion particles corresponding to a specific color (for example, quantum dots of a specific color) and/or respective light conversion particles LCP including light scattering particles.

The first light conversion layer CCL1 may include first light conversion particles LCP1. In an embodiment, the first light conversion particles LCP1 may include quantum dots (for example, red quantum dots) of a first color that convert light of a third color (for example, blue) emitted from the light emitting elements LD provided in the first light emitting area EA1 into light of a first color (for example, red). Accordingly, the first pixel PX1 may emit light of the first color. In an embodiment, the first light conversion particles LCP1 may optionally further include the light scattering particles. Accordingly, the light efficiency of the first pixel PX1 may be increased.

The second light conversion layer CCL2 may include second light conversion particles LCP2. In an embodiment, the second light conversion particles LCP2 may include quantum dots (for example, green quantum dots) of a second color that convert light of a third color (for example, blue) emitted from the light emitting elements LD provided in the second light emitting area EA2 into light of a second color (for example, green). Accordingly, the second pixel PX2 may emit light of the second color. In an embodiment, the second light conversion particles LCP2 may optionally further include the light scattering particles. Accordingly, the light efficiency of the second pixel PX2 may be increased.

The third light conversion layer CCL3 may include third light conversion particles LCP3. In an embodiment, the third light conversion particles LCP3 may include the light scattering particles. Accordingly, the light efficiency of the third pixel PX3 may be increased. In another example, the third pixel PX3 may not include the third light conversion layer CCL3. For example, the third pixel PX3 may include a transparent polymer instead of the third light conversion layer CCL3.

The protective layers PRL may be provided on the light conversion layers CCL. For example, a first protective layer PRL1, a second protective layer PRL2, and a third protective layer PRL3 may be disposed on the first light conversion layer CCL1, the second light conversion layer CCL2, and the third light conversion layer CCL3, respectively.

The protective layers PRL may be inorganic films (for example, inorganic insulating films). For example, the protective layers PRL may be a single-layered or multi-layered inorganic film made of a silicon nitride ($SiN_x$), a silicon oxide ($SiO_x$), a silicon oxynitride ($SiO_xN_y$), an aluminum oxide ($AlO_x$), or another inorganic insulating material. The protective layers PRL may be positioned on respective light conversion layers CCL to cover the light conversion layers CCL, thereby protecting the light conversion layers CCL.

The second bank BNK2 may be provided between the light conversion layers CCL. For example, the second bank BNK2 may include openings corresponding to the light emitting areas EA of the pixels PX, and may surround the light emitting areas EA. The second bank BNK2 may be disposed in the non-light emitting area NEA to overlap the first bank BNK1. The second bank BNK2 may include a light blocking and/or reflective material including a black matrix material. The second bank BNK2 may include the same material as or different material from the first bank BNK1.

The fourth insulating layer INS4 (or a planarization layer) may be provided on the light conversion layers CCL and the second bank BNK2. The fourth insulating layer INS4 may be a single layer or multilayer including an organic film (for example, an organic insulating film), and may have a flat surface while reducing a step occurring by constituent elements disposed thereunder. The fourth insulating layer INS4 may be entirely provided in the display area DA, and may be directly disposed on the protective layers PRL.

The color filter layer CFL may be disposed on the fourth insulating layer INS4. The color filter layer CFL may include color filters CF corresponding to respective pixels PX. For example, the color filter layer CFL may include a first color filter CF1 disposed in the first light emitting area EA1 to overlap the first light emitting part EMU1 and the first light conversion layer CCL1 in a plan view, a second color filter CF2 disposed in the second light emitting area EA2 to overlap the second light emitting part EMU2 and the second light conversion layer CCL2 in a plan view, and a third color filter CF3 disposed in the third light emitting area EA3 to overlap the third light emitting part EMU3 and/or the third light conversion layer CCL3 in a plan view.

The first color filter CF1 may selectively transmit light of a color corresponding to the first pixel PX1. For example, the first color filter CF1 may be a color filter of a first color (for example, a red color filter).

The second color filter CF2 may selectively transmit light of a color corresponding to the second pixel PX2. For example, the second color filter CF2 may be a color filter of a second color (for example, a green color filter).

The third color filter CF3 may selectively transmit light of a color corresponding to the third pixel PX3. For example, the third filter CF3 may be a color filter of a third color (for example, a blue color filter).

In an embodiment, the first, second, and third color filters CF1, CF2, and CF3 may be disposed to overlap each other in the non-light emitting area NEA, thereby blocking color mixing between the pixels PX. In another embodiment, the first, second, and third color filters CF1, CF2, and CF3 may be formed as individual patterns that are separated from each other on the first, second, and third light emitting areas EA1, EA2, and EA3, respectively, and a separate light blocking pattern (for example, a light blocking pattern LBP of FIG. 13) may be disposed between the first, second, and third color filters CF1, CF2, and CF3.

An encapsulation layer ENC may be disposed on the color filter layer CFL. In an embodiment, the encapsulation layer ENC may be a single-layered or multi-layered insulating layer including a fifth insulating layer INS5 as shown in FIG. 8 to FIG. 12. The fifth insulating layer INS5 may be entirely formed in the display area DA to cover the pixel circuit layer PCL, the display element layer DPL, and/or the color filter layer CFL. The fifth insulating layer INS5 may include at least one organic film and/or inorganic film. In an embodiment, the fifth insulating layer INS5 may include an organic film (for example, an organic insulating film), and may have a flat surface while reducing a step occurring by constituent elements disposed thereunder.

In an embodiment, the encapsulation layer ENC may include a substrate UPL (for example, an upper substrate of the display panel DP) as shown in FIG. 13. The substrate UPL may be a rigid substrate or a flexible film-type substrate. The substrate BSL may be a single-layered or multi-layered substrate or film. The base layer BSL and the substrate UPL may include the same material or different materials.

In an embodiment, the color filter layer CFL may be provided on a surface of the substrate UPL to face the display element layer DPL. For example, the first, second, and third color filters CF1, CF2, and CF3 may be directly formed and/or provided on a surface (for example, a lower surface) of the substrate UPL, and may be respectively disposed to face the first light conversion layer CCL1, the second light conversion layer CCL2, and the third light conversion layer CCL3.

In an embodiment, the first, second, and third color filters CF1, CF2, and CF3 may be provided in the first, second, and third light emitting areas EA1, EA2, and EA3, respectively, and the light blocking pattern LBP may be provided between the first, second, and third color filters CF1, CF2, and CF3. The light blocking pattern LBP may include openings corresponding to the first, second, and third light emitting areas EA1, EA2, and EA3.

In an embodiment, the display panel DP may not include the encapsulation layer ENC. For example, the display panel DP may be manufactured to not include the encapsulation layer ENC, and a separately manufactured protective film may be provided on the display panel DP.

According to the above-described embodiments, by disposing the first layer LR between the light emitting parts EMU and the light conversion layers CCL, the light emitting parts EMU and the light conversion layers CCL may be spaced apart from each other. Accordingly, deterioration of the light conversion layers CCL (for example, deterioration of the light conversion particles LCP) may be reduced or prevented by appropriately protecting the light conversion layers CCL from heat and light generated by the light emitting parts EMU.

In some embodiments, the first layer LR may be formed as a low refractive index layer and/or a light scattering layer having a refractive index equal to or less than that of at least one insulating layer (for example, portions of the first insulating layer INS1 and/or the third insulating layer INS3 in contact with the first layer LR) provided to the light emitting parts EMU. Accordingly, the light efficiency of the pixels PX may be improved by increasing the front light output rate (for example, a ratio of light incident from respective light emitting parts EMU to respective light conversion layers CCL) of the light generated by the light emitting parts EMU.

Although the disclosure has been specifically described according to the above-described embodiments, it should be noted that the embodiments are for describing the disclosure and not for limiting its scope. It will be understood by those skilled in the art that various changes in form and details may be made therein without departing from the scope of the disclosure.

The technical scope of the disclosure may be determined by on the technical scope of the accompanying claims. All changes or modifications that come within the meaning and range of the claims and their equivalents will be interpreted as including the range of the disclosure.

What is claimed is:

1. A display device comprising:
   a pixel disposed in a display area, wherein
   the pixel includes:
      a light emitting part that includes:
         a light emitting element;
         pixel electrodes disposed on a first end portion and a second end portion of the light emitting element; and
         at least one insulating layer;
      a light conversion layer disposed on the light emitting part, the light conversion layer including light conversion particles; and
      a first layer disposed between the light emitting part and the light conversion layer, and
   a refractive index of the first layer is equal to or less than a refractive index of the at least one insulating layer.

2. The display device of claim 1, wherein the at least one insulating layer includes at least one of:
   a first insulating layer disposed under the light emitting element;
   a second insulating layer disposed on a portion of the light emitting element, the second insulating layer exposing the first end portion and the second end portion of the light emitting element; and
   a third insulating layer disposed on one of the pixel electrodes and disposed between the pixel electrodes.

3. The display device of claim 2, wherein
the first layer contacts a portion of the first insulating layer, and
the refractive index of the first layer is equal to or less than a refractive index of the first insulating layer.

4. The display device of claim 2, wherein
the first layer contacts a portion of the third insulating layer, and
the refractive index of the first layer is equal to or less than a refractive index of the third insulating layer.

5. The display device of claim 1, wherein the first layer includes an inorganic film disposed in a light emitting area of the pixel, the light emitting area being provided with the light emitting part.

6. The display device of claim 5, wherein the first layer is disposed on an entire area of the display area including the light emitting area.

7. The display device of claim 5, wherein the first layer is individually patterned to correspond to the light emitting area, and is disposed on an entire area of the light emitting area.

8. The display device of claim 1, wherein
the first layer includes an organic film disposed in a light emitting area of the pixel, the light emitting area being provided with the light emitting part, and
the pixel includes a second layer disposed between the first layer and the light conversion layer, the second layer including an inorganic layer.

9. The display device of claim 8, wherein
the first layer is disposed on an entire area of the display area including the light emitting area, and
the second layer is disposed on an entire upper portion of the first layer at least in the light emitting area.

10. The display device of claim 8, wherein
the first layer is individually patterned to correspond to the light emitting area, and
the second layer is disposed on an entire area of the display area including the light emitting area.

11. The display device of claim 8, wherein
the first layer is individually patterned to correspond to the light emitting area, and
the second layer is individually patterned to correspond to the light emitting area and is disposed on an entire area of the light emitting area.

12. The display device of claim 1, wherein the first layer includes a light scattering layer that is disposed on an entire area of a light emitting area of the pixel, the light emitting area being provided with the light emitting part, the light scattering layer including light scattering particles.

13. The display device of claim 1, wherein the light conversion particles include quantum dots.

14. A pixel comprising:
a light emitting part that includes:
a light emitting element;
pixel electrodes disposed on a first end portion and a second end portion of the light emitting element; and
at least one insulating layer;
a light conversion layer disposed on the light emitting part, the light conversion layer including light conversion particles; and
a first layer disposed between the light emitting part and the light conversion layer,
wherein a refractive index of the first layer is equal to or less than a refractive index of the at least one insulating layer.

15. The pixel of claim 14, wherein the at least one insulating layer includes at least one of:
a first insulating layer disposed under the light emitting element;
a second insulating layer disposed on a portion of the light emitting element, the second insulating layer exposing the first end portion and the second end portion of the light emitting element; and
a third insulating layer disposed on one of the pixel electrodes and between the pixel electrodes.

16. The pixel of claim 15, wherein
the first layer contacts a portion of the first insulating layer, and
the refractive index of the first layer is equal to or less than a refractive index of the first insulating layer.

17. The pixel of claim 15, wherein
the first layer contacts a portion of the third insulating layer, and
the refractive index of the first layer is equal to or less than a refractive index of the third insulating layer.

18. The pixel of claim 14, wherein the first layer includes an inorganic film disposed on an entire area of a light emitting area of the pixel, the light emitting area being provided with the light emitting part.

19. The pixel of claim 14, wherein
the first layer includes an organic film disposed on an entire area of a light emitting area of the pixel, the light emitting area being provided with the light emitting part, and
the pixel includes an inorganic film disposed between the first layer and the light conversion layer.

20. The pixel of claim 14, wherein the first layer includes a light scattering layer that is disposed on an entire area of a light emitting area of the pixel, the light emitting area being provided with the light emitting part, the light scattering layer including light scattering particles.

* * * * *